United States Patent
Inoue et al.

(10) Patent No.: US 10,418,592 B2
(45) Date of Patent: Sep. 17, 2019

(54) ORGANIC ELECTROLUMINESCENCE DEVICE, PRODUCTION METHOD FOR ORGANIC ELECTROLUMINESCENCE DEVICE, ILLUMINATION DEVICE AND DISPLAY DEVICE

(71) Applicant: Sharp Kabushiki Kaisha, Sakai, Osaka (JP)

(72) Inventors: Satoshi Inoue, Sakai (JP); Katsuhiro Kikuchi, Sakai (JP); Shinichi Kawato, Sakai (JP); Eiji Koike, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 15/773,573

(22) PCT Filed: Nov. 15, 2016

(86) PCT No.: PCT/JP2016/083796
§ 371 (c)(1),
(2) Date: May 4, 2018

(87) PCT Pub. No.: WO2017/086306
PCT Pub. Date: May 26, 2017

(65) Prior Publication Data
US 2018/0323404 A1 Nov. 8, 2018

(30) Foreign Application Priority Data
Nov. 16, 2015 (JP) ................................. 2015-224303

(51) Int. Cl.
*H01L 51/52* (2006.01)
*H01L 27/32* (2006.01)
(Continued)

(52) U.S. Cl.
CPC ............ *H01L 51/5271* (2013.01); *G09F 9/00* (2013.01); *G09F 9/30* (2013.01); *H01L 27/3246* (2013.01);
(Continued)

(58) Field of Classification Search
CPC ..... H01L 51/5271; H01L 51/50; H01L 51/56; H01L 51/5016; H01L 51/5072;
(Continued)

(56) References Cited

U.S. PATENT DOCUMENTS

2014/0264291 A1  9/2014  Zhang et al.
2015/0090992 A1  4/2015  Miyazawa et al.

FOREIGN PATENT DOCUMENTS

JP   2003-229283 A   8/2003
JP   2006-221902 A   8/2006
(Continued)

OTHER PUBLICATIONS

Official Communication issued in International Patent Application No. PCT/JP2016/083796, dated Feb. 21, 2017.

*Primary Examiner* — Nikolay K Yushin
(74) *Attorney, Agent, or Firm* — Keating & Bennett, LLP

(57) ABSTRACT

An organic electroluminescence device according to an aspect of the disclosure includes a base material including one face provided with a recessed portion; and a light emitting element including a reflective layer provided on at least a surface of the recessed portion, a filling layer having optical transparency and filling the inside of the recessed portion with the reflective layer interposed between the filling layer and the recessed portion, a first electrode having optical transparency and provided on at least an upper-layer side of the filling layer, an organic layer containing at least a light emitting layer and provided on an upper layer of the first electrode, a second electrode having optical transpar-
(Continued)

ency and provided on an upper-layer side of the organic layer, and an edge cover layer covering at least an end portion of the first electrode, and in the organic electroluminescence device, an upper face of the first electrode at a position of the recessed portion is positioned below a plane including an upper face of the reflective layer, and the end portion of the first electrode is located inside the recessed portion and at a distance from the reflective layer.

9 Claims, 19 Drawing Sheets

(51) Int. Cl.
  *G09F 9/00* (2006.01)
  *G09F 9/30* (2006.01)
  *H01L 51/56* (2006.01)
  *H01L 51/50* (2006.01)

(52) U.S. Cl.
  CPC ...... *H01L 27/3248* (2013.01); *H01L 27/3258* (2013.01); *H01L 51/5209* (2013.01); *H01L 51/56* (2013.01); *H01L 27/3211* (2013.01); *H01L 51/5016* (2013.01); *H01L 51/5072* (2013.01); *H01L 51/5088* (2013.01); *H01L 51/5092* (2013.01); *H01L 51/5206* (2013.01); *H01L 51/5234* (2013.01); *H01L 2227/323* (2013.01); *H01L 2251/5315* (2013.01); *H01L 2251/558* (2013.01)

(58) Field of Classification Search
  CPC ............ H01L 51/5088; H01L 51/5092; H01L 51/5206; H01L 51/523; H01L 27/32; H01L 27/3246; H01L 27/3211; H01L 2227/323; H01L 2251/5315; H01L 2251/558; H05B 33/02; H05B 33/10; H05B 33/12; H05B 33/22; H05B 33/24; H05B 33/28; G09F 9/00; G09F 9/30
  See application file for complete search history.

(56) References Cited

FOREIGN PATENT DOCUMENTS

| | | |
|---|---|---|
| JP | 2008-226483 A | 9/2008 |
| JP | 2015-072751 A | 4/2015 |

ORGANIC ELECTROLUMINESCENCE DEVICE, PRODUCTION METHOD FOR ORGANIC ELECTROLUMINESCENCE DEVICE, ILLUMINATION DEVICE AND DISPLAY DEVICE

TECHNICAL FIELD

Some aspects of the disclosure relate to an organic electroluminescence device, a production method for an organic electroluminescence device, an illumination device and a display device.

The present application claims priority based on JP 2015-224303 filed in Japan on Nov. 16, 2015, the contents of which are incorporated herein by reference.

BACKGROUND ART

Presently, organic ElectroLuminescence (EL) devices are being developed as candidates for next-generation display technology. An organic EL element is a light emitting element, luminescent components of which emit light evenly in all directions. Therefore, some components emitting light within a Light Emitting Layer (EML) are completely reflected due to a difference in refractive index between an organic layer and air, and the light is guided within the element and is not extracted to the outside.

For example, when a refractive index of the light emitting layer is 1.8, approximately 20% of luminescent components are extracted vertically, but approximately 80% of the luminescent components are sealed between a reflective layer 3 (AL) and an air layer. When the refractive index of the light emitting layer differs from a refractive index of air, the luminescent components become sealed within a layer between the reflective layer 3 and the air layer according to the principle of refraction.

PTL 1 describes a planar display device including a light reflective layer configured to reflect light discharged to a support substrate side. The light reflective layer includes a plurality of recessed portions as incident angle adjustment parts disposed at a distance from a plurality of display elements with an insulating layer having optical transparency interposed between the display elements and the recessed portions to orient each beam of reflected light toward the corresponding display element, and each recessed portion includes an inclined face along an outer edge of an organic light emitting layer of the corresponding display element.

CITATION LIST

Patent Literature

PTL 1: JP 2003-229283 A

SUMMARY

Technical Problem

In the configuration of PTL 1, a reflective member reflects emitted light and thus the light is extracted to the film surface side, but most of light components propagating an anode electrode illustrated in FIG. 3 in the lateral direction are not extracted to the display surface side. In particular, most of light discharged in the lateral direction from a right end face of the anode electrode scatters within the film and cannot be extracted to the display surface side. Therefore, light extraction efficiency is low, and light emission luminance on the display surface side is insufficient.

Thus, in an organic EL element including the configuration of the related art, only approximately 20% of light from the light emitting layer is extracted to the outside, and there is a problem of low luminous current efficiency.

One aspect of the disclosure has been conceived in light of the problem of the related art described above, and an object of the disclosure is to provide an organic electroluminescence device, a production method for an organic electroluminescence device, an illumination device and a display device capable of enhancing light extraction efficiency and increasing luminous current efficiency.

Solution to Problem

An organic electroluminescence device according to an aspect of the disclosure includes a substrate including one face provided with a recessed portion; and a light emitting element including a reflective layer provided on at least a surface of the recessed portion, a filling layer having optical transparency and filling the inside of the recessed portion with the reflective layer interposed between the filling layer and the recessed portion, a first electrode having optical transparency and provided on at least an upper-layer side of the filling layer, an organic layer containing at least a light emitting layer and provided on an upper layer of the first electrode, a second electrode having optical transparency and provided on an upper-layer side of the organic layer, and an edge cover layer covering at least an end portion of the first electrode. In the organic electroluminescence device, an upper face of the first electrode at a position of the recessed portion is positioned below a plane including an upper face of the reflective layer, and the end portion of the first electrode is located inside the recessed portion and at a distance from the reflective layer.

In addition, in the organic electroluminescence device according to an aspect of the disclosure, an end portion of the edge cover layer may be formed in a pattern shape following a shape of a circumference of the recessed portion in a normal direction of the substrate.

In addition, the organic electroluminescence device according to an aspect of the disclosure may include a plurality of unit light emitting regions separated from one another, and the unit light emitting regions may each include a first region where a central portion of the first electrode is located and a second region where the end portion of the first electrode is located, and the recessed portion may be provided in the second region.

In addition, in the organic electroluminescence device according to an aspect of the disclosure, the recessed portion may also be provided in the first region.

In addition, in the organic electroluminescence device according to an aspect of the disclosure, the recessed portion may not be provided in the first region, and upper faces of the reflective layer, the first electrode and the organic layer may be formed as smooth faces.

In addition, in the organic electroluminescence device according to an aspect of the disclosure, a second recessed portion may be provided adjacent to the recessed portion in the second region, and the end portion may be located at a distance from the reflective layer inside the second recessed portion.

In addition, in the organic electroluminescence device according to an aspect of the disclosure, a cross-sectional shape of the second recessed portion may be a parabola shape, and the second recessed portion may be formed to include the end portion as a focal point.

A production method for an organic electroluminescence device according to an aspect of the disclosure includes: forming a recessed portion on one face side of a base material; and forming a light emitting element by forming a reflective layer along at least a surface of the recessed portion, forming a filling layer having optical transparency on the inside of the recessed portion with the reflective layer interposed between the filling layer and the recessed portion, forming a first electrode having optical transparency on at least an upper-layer side of the filling layer, forming an organic layer containing at least a light emitting layer on an upper-layer side of the first electrode, and forming a second electrode having optical transparency and light reflectivity on an upper-layer side of the organic layer. In the production method, when the first electrode is formed, an end portion of the first electrode is located inside the recessed portion and at a distance from the reflective layer inside the recessed portion.

An illumination device according to an aspect of the disclosure includes a base material including one face provided with a recessed portion; and a light emitting element including a reflective layer provided on at least a surface of the recessed portion, a filling layer having optical transparency and filling the inside of the recessed portion with the reflective layer interposed between the filling layer and the recessed portion, a first electrode having optical transparency and provided on at least an upper-layer side of the filling layer, an organic layer containing at least a light emitting layer and provided on an upper layer of the first electrode, a second electrode having optical transparency and provided on an upper-layer side of the organic layer, and an edge cover layer covering at least an end portion of the first electrode. In the illumination device, an upper face of the first electrode at a position of the recessed portion is positioned below a plane including an upper face of the reflective layer, and the end portion of the first electrode is located inside the recessed portion and at a distance from the reflective layer.

A display device according to an aspect of the disclosure includes a base material including one face provided with a recessed portion; and a light emitting element including a reflective layer provided on at least a surface of the recessed portion, a filling layer having optical transparency and filling the inside of the recessed portion with the reflective layer interposed between the filling layer and the recessed portion, a first electrode having optical transparency and provided on at least an upper-layer side of the filling layer, an organic layer containing at least a light emitting layer and provided on an upper layer of the first electrode, a second electrode having optical transparency and provided on an upper-layer side of the organic layer, and an edge cover layer covering at least an end portion of the first electrode. In the display device, an upper face of the first electrode at a position of the recessed portion is positioned below a plane including an upper face of the reflective layer, and the end portion of the first electrode is located inside the recessed portion and at a distance from the reflective layer.

Advantageous Effects of Disclosure

According to some aspects of the disclosure, an organic electroluminescent device, a production method for an organic electroluminescence device, an illumination device and a display device capable of enhancing light extraction efficiency and increasing luminous current efficiency can be provided.

DESCRIPTION OF EMBODIMENTS

Figure 1:
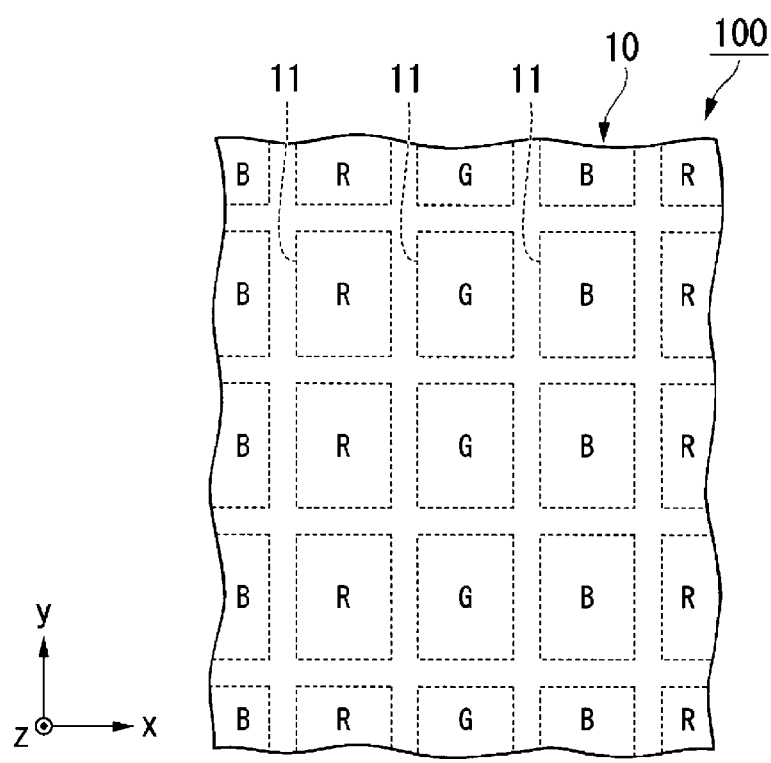
FIG. 1 is a view illustrating a display region of an organic EL device of a first embodiment.

An organic electroluminescence device (organic EL device) of an embodiment of the disclosure will be described below. The organic EL device of each embodiment of the disclosure is an example of a top-emitting organic EL device employing a microcavity structure.

Note that each of the drawings below may be illustrated at a different dimensional scale depending on components to make it easy to view each component. In addition, the light extraction direction is the upward direction in the drawings.
First Embodiment First, an organic EL device of a first embodiment will be described.

FIG. 1 is a view illustrating a display region of the organic EL device of the first embodiment.

Figure 2:
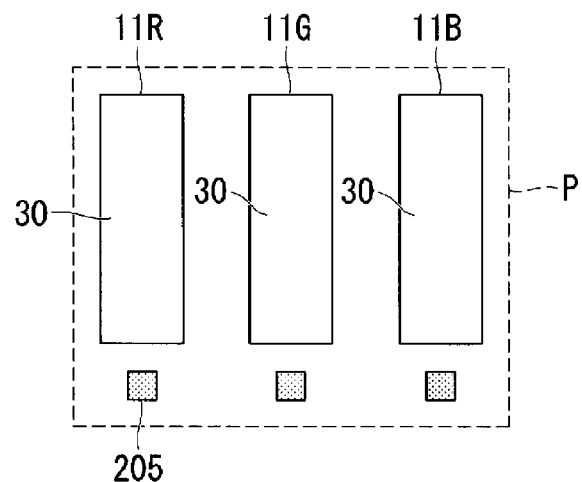
FIG. 2 is a plan view illustrating one pixel in the organic EL device of the first embodiment.

FIG. 2 is a plan view illustrating one pixel in the organic EL device of the first embodiment.

Figure 3:
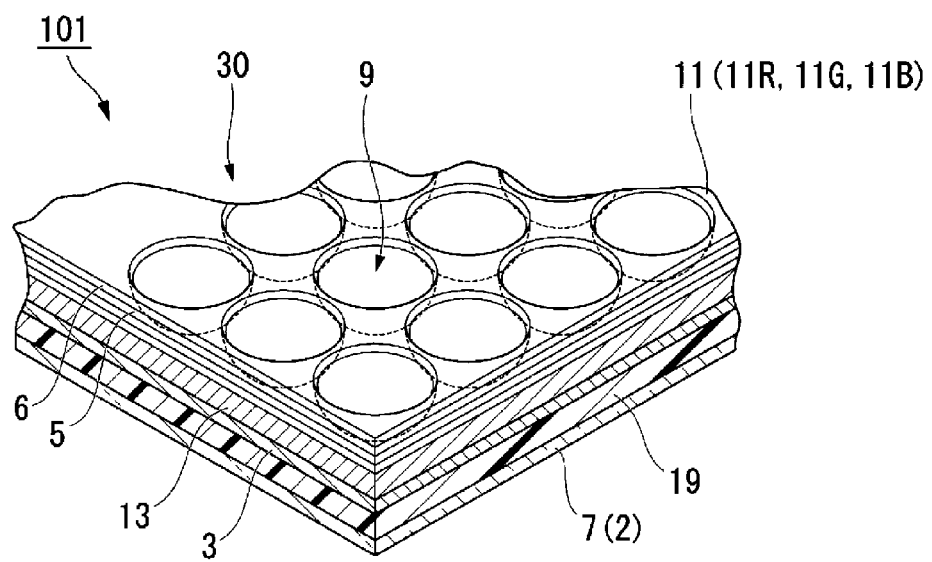
FIG. 3 is a cross-sectional view along a given plane orthogonal to an upper face of the organic EL device.

FIG. 3 is a cross-sectional view along a given plane orthogonal to an upper face of the organic EL device.

Figure 4A:
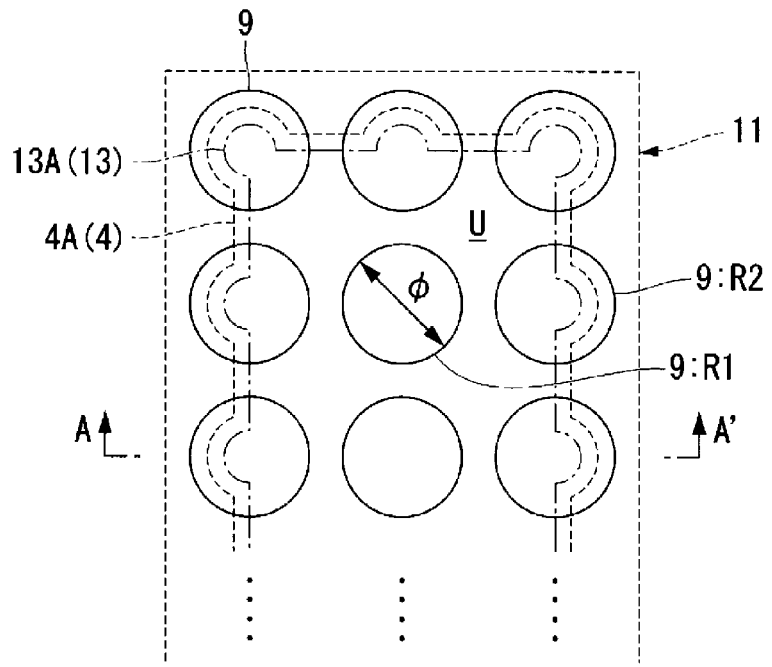
FIG. 4A is an enlarged plan view illustrating a portion of a sub-pixel.
Figure 4B:
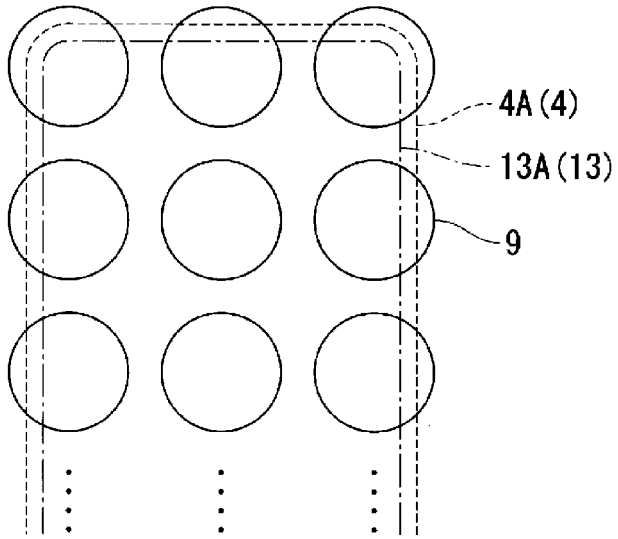
FIG. 4B is a plan view illustrating a variation of a sub-pixel.

FIG. 4A is an enlarged plan view illustrating a portion of a sub-pixel, and FIG. 4B is a plan view illustrating a variation.

Figure 5:
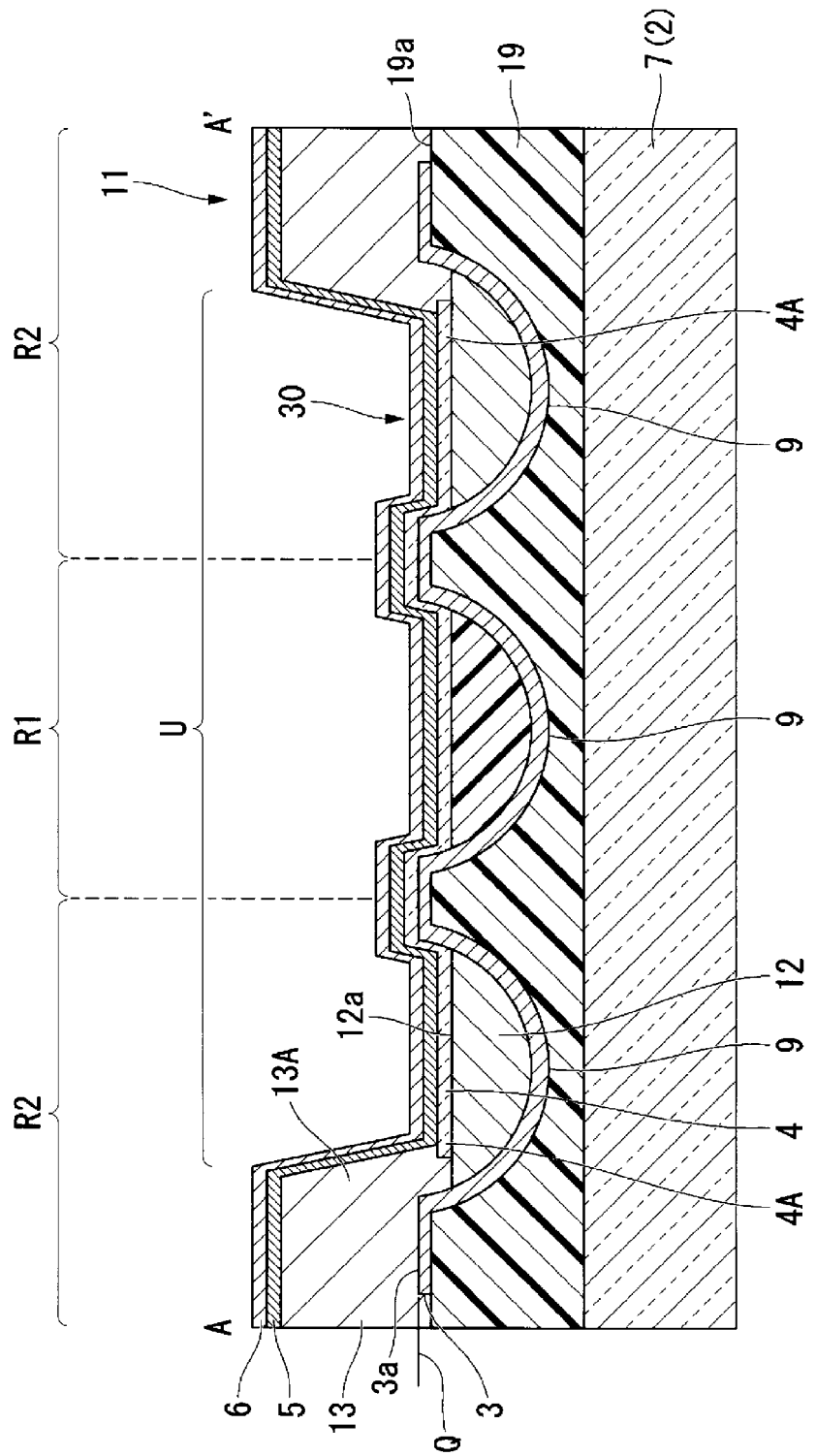
FIG. 5 is a cross-sectional view along line A-A' in FIG. 4A.

FIG. 5 is a cross-sectional view along line A-A' in FIG. 4A.

Figure 6:
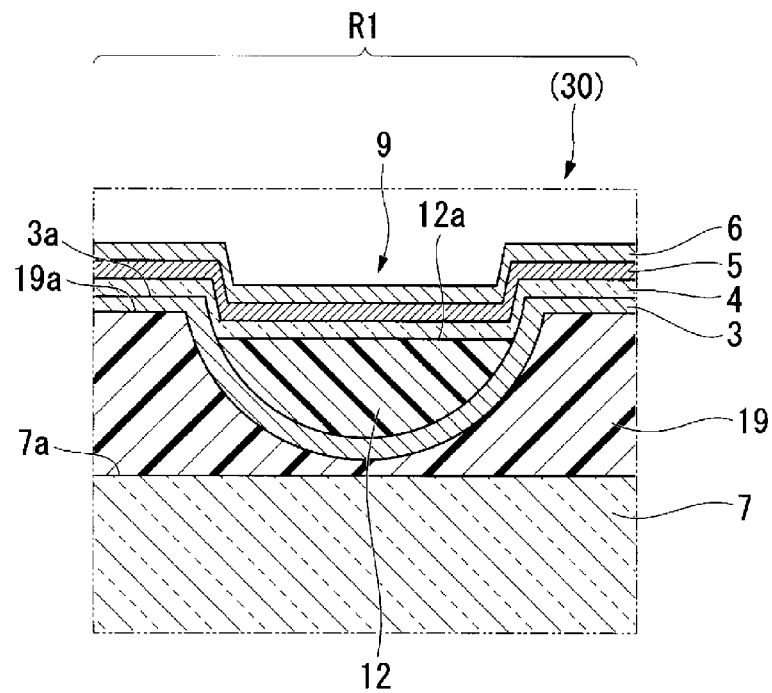
FIG. 6 is a cross-sectional view illustrating a recessed portion structure located in a central region of the sub-pixel.

FIG. 6 is a cross-sectional view illustrating a recessed portion structure located in a central region of the sub-pixel.

Figure 7:
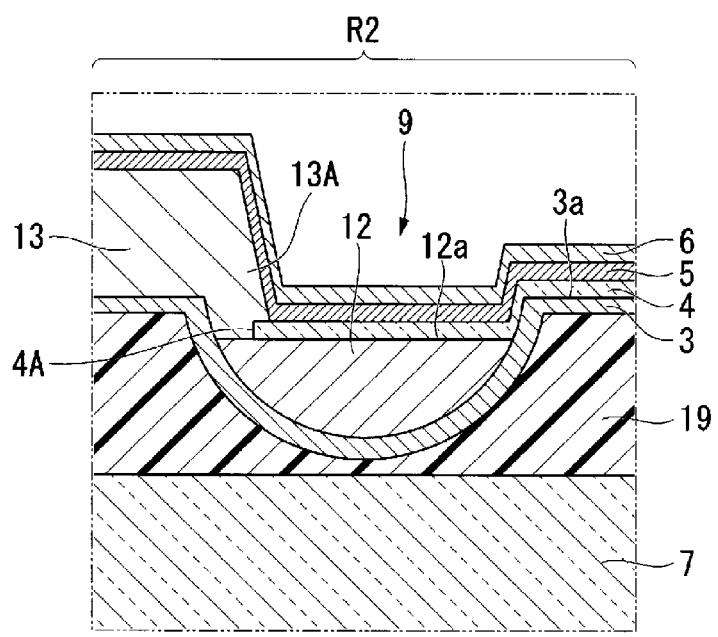
FIG. 7 is a cross-sectional view illustrating the recessed portion structure located in a peripheral region of the sub-pixel.

FIG. 7 is a cross-sectional view illustrating the recessed portion structure located in a peripheral region of the sub-pixel.

As illustrated in FIG. 1, an organic EL device (organic electroluminescence device and display device) 100 includes a plurality of unit light emitting regions 11 separated from one another. Here, the organic EL device 100 includes a display region 10 including the plurality of unit light emitting regions 11 corresponding to RGB. The respective unit light emitting regions 11 extend in a stripe shape along a y-axis and are repeatedly disposed in the order of RGB along an x-axis. FIG. 1 illustrates an example in which the respective unit light emitting regions 11 corresponding to RGB are disposed in stripe arrangement, but this embodiment is not limited to this arrangement, and the respective unit light emitting regions 11 corresponding to RGB can also be disposed in a RGB pixel arrangement known in the related art such as mosaic arrangement and delta arrangement.

The organic EL device 100 can be used as an illumination device configured to produce white light when the respective unit light emitting regions 11 corresponding to RGB emit red light, green light and blue light simultaneously. However, applications of the organic EL device 100 are not limited to an illumination device. For example, the organic EL device 100 can also be applied to a display device in which, as illustrated in FIG. 2, the unit light emitting regions 11 corresponding to red, green and blue include a red sub-pixel 11R, a green sub-pixel 11G and a blue sub-pixel 11B, respectively, and these three sub-pixels 11R, 11G and 11B constitute one pixel P.

Note that when the sub-pixels 11R, 11G and 11B are not distinguished from one another, the sub-pixels 11R, 11G and 11B may simply be referred to as sub-pixels 11. Here, as an example, the sub-pixels 11 each have a size of 0.078 mm×0.026 mm, and one pixel has a size of 90 μm×90 μm.

As illustrated in FIGS. 3, 4A and 4B, a plurality of recessed portions 9 each having a circular shape in a plan view are formed in each of the sub-pixels 11R, 11G and 11B. Specifically, the plurality of recessed portions 9 are provided in a roughly entire region including a central region (first region) R1 and a peripheral region (second region) R2 of the sub-pixel 11. A diameter φ of the recessed portion 9 is, for example, approximately 5 μm. The plurality of recessed portions 9 are disposed in a regular manner in the lateral and vertical directions at a pitch of 7 μm to form a lattice shape. Density of the recessed portions 9 is in such an extent that a proportion of the entire area of the plurality of recessed portions 9 occupying the sub-pixel region (light emission area U) is 70%. In FIGS. 4A and 4B, the light emission area U is a region surrounded by an edge cover layer 13.

In this embodiment, the recessed portions 9 provided in the central region R1 and the recessed portions 9 provided in the peripheral region R2 of the sub-pixel 11 have the same shape.

In this embodiment, the recessed portions 9 formed in the peripheral region R2 of the sub-pixel 11 overlap with a peripheral portion 4A of a first electrode 4 in a plan view. In addition, the recessed portions 9 other than the recessed portions 9 formed in the peripheral region R2 of the sub-pixel 11, that is, the recessed portions 9 formed in the central region R1, all overlap with a central portion of the first electrode 4 in a plan view.

The organic EL device 100 of this embodiment includes a display panel (not illustrated) including a TFT array substrate 101 as illustrated in FIG. 3, a plurality of thin film transistors (not illustrated) provided in prescribed arrangement with respect to the plurality of sub-pixels 11 in the display region, various kinds of wiring lines (not illustrated) connected to each thin film transistor, and a sealing substrate (not illustrated) provided to cover the plurality of thin film transistors and the various kinds of wiring lines. The thin film transistors and organic EL elements (light emitting elements) 30 are electrically connected via a reflective layer 3 and a contact portion 205. Since one pixel 1 is divided into the three sub-pixels 11 and the respective sub-pixels 11 are driven independently of one another, any color can be displayed depending on a manner of causing each sub-pixel 11 to emit light.

As illustrated in FIG. 3, the TFT array substrate 101 includes a substrate 2, the reflective layer 3, the first electrode 4, an organic layer 5 including a light emitting layer, a second electrode 6 and the edge cover layer 13, and includes an organic EL element 30 provided for each sub-pixel 11.

Specifically, the substrate 2 includes a base material 7 and an underlayer (not illustrated). A TFT layer (not illustrated), a flattening resin layer 19, the reflective layer 3, the first electrode 4, the edge cover layer 13, the organic layer 5 including a light emitting layer and the second electrode 6 are layered in this order from the base material 7 side on an upper face of the base material 7. The organic EL element 30 is formed on the plurality of recessed portions (first recessed portions) 9 formed in the flattening resin layer 19, and the organic EL element 30 includes the reflective layer 3, a filling layer 12, the first electrode 4, the organic layer 5 including a light emitting layer and the second electrode 6. The organic EL device 100 is a top-emitting organic EL device in which light emitted from the light emitting layer is emitted from the second electrode 6 (light emitting face) side.

For example, a glass substrate or a flexible polyimide substrate is used for the base material 7. Note that since the organic EL device 100 is a top-emitting organic EL device, the base material 7 does not need to have optical transparency, and, for example, a semiconductor substrate such as a silicon substrate may be used.

The flattening resin layer 19 includes a photosensitive resin such as an acrylic resin, an epoxy resin and a polyimide resin. Use of the photosensitive resin for the material of the flattening resin layer 19 is suitable for a method for forming the recessed portions 9 described below. However, when a method other than the forming method described below is employed, the constituent material of the flattening resin layer 19 does not need to be photosensitive. Further, the constituent material of the flattening resin layer 19 may be a material other than a resin, and an inorganic material may be used.

The plurality of recessed portions 9 are formed in regions corresponding to the sub-pixels 11 in the flattening resin layer 19.

Each recessed portion 9 opens upward in an upper face 2a of the substrate 2, and a cross-sectional shape of the recessed portion 9 is an arc shape. That is, an inner face of each recessed portion 9 forms part of a three-dimensional spherical surface. Note that the shape of the recessed portion 9 is not limited to an arc shape.

In this embodiment, the substrate 2 including the base material 7 and the underlayer is used, but the underlayer does not need to be used, and the recessed portions 9 may be formed in the substrate itself.

The reflective layer 3 is provided for each sub-pixel 11 and is formed in the light emission area U of each sub-pixel 11. As illustrated in FIGS. 5 and 6, the reflective layer 3 is formed on an upper face 19a of the flattening resin layer 19 including inner faces of the plurality of recessed portions 9. The reflective layer 3 extends beyond the recessed portions 9 formed in the peripheral region R2 of the sub-pixels 11, and is in contact with the edge cover layer 13. In addition, in this embodiment, the reflective layer 3 may be formed continuously on the plurality of recessed portions 9 or may be formed discontinuously for each recessed portion 9. A metal having high reflectivity such as aluminum and silver is suitably used as a constituent material of the reflective layer 3. In the case of this embodiment, the reflective layer 3 includes, for example, an aluminum vapor deposition film having a film thickness of 100 nm.

The filling layer 12 fills the inside of each of the recessed portions 9 with the reflective layer 3 interposed between the filling layer 12 and the recessed portion 9. An upper face 12a of the filling layer 12 is positioned lower than a plane Q including an upper face 3a of the reflective layer 3.

The filling layer 12 includes a resin having optical transparency.

Specifically, an acrylic resin having a transmittance of 95% is used for the material of the filling layer 12. A refractive index of the filling layer 12 of this embodiment is, for example, 1.5.

A plurality of the first electrodes 4 are provided for each sub-pixel 11. The first electrodes 4 in the sub-pixels 11 are formed on the upper faces 12a of the filling layers 12 provided respectively in the plurality of recessed portions 9 located in the light emission area U and are formed on the upper face 3a of the reflective layer 3. A portion of the first electrode 4 positioned on the upper face 19a of the flattening resin layer 19 is in contact with a portion of the reflective layer 3. A lower face of the first electrode 4 is in contact with the upper face 12a of the filling layer 12 at a position inside each recessed portion 9. Accordingly, the lower face of the first electrode 4 is positioned lower than the plane Q including the upper face 3a of the reflective layer 3.

The first electrode 4 is a transparent electrode including a transparent conductive film such as Indium Tin Oxide (ITO) and Indium Zinc Oxide (IZO) and has optical transparency. In the case of this embodiment, the first electrode 4 includes, for example, ITO having a film thickness of 120 nm. The first electrode 4 functions as a positive electrode to inject holes into the organic layer 5.

As illustrated in FIG. 4A, the peripheral portion 4A of the first electrode 4 is formed along a shape of each recessed portion 9 having a circular shape in a plan view.

As illustrated in FIGS. 5 and 7, the edge cover layer 13 is formed on the upper face 19a of the flattening resin layer 19 including the upper face 3a of the reflective layer 3. The edge cover layer 13 is formed such that a peripheral portion (end portion) 13A of the edge cover layer 13 is in contact with the recessed portions 9 formed in the peripheral region R2 of the sub-pixel 11 and enters the recessed portions 9, and the edge cover layer 13 covers the peripheral portion 4A of the first electrode 4 located in the recessed portions 9. The edge cover layer 13 does not come into contact with the recessed portions 9 other than the recessed portions 9 formed in the peripheral region R2 of the sub-pixel 11, that is, the recessed portions 9 formed in the central region R1.

The same material as the material of the filling layer 12 described above can be used as the edge cover layer 13, and the edge cover layer 13 is formed by an ordinary photoetching process. The edge cover layer 13 defines the light emission area U in a prescribed pattern.

As illustrated in FIGS. 4A and 4B, the peripheral portion 13A of the edge cover layer 13 is formed along a shape of each recessed portion 9 having a circular shape in a plan view, and the peripheral portion 13A entirely covers the peripheral portion 4A of the first electrode 4.

Note that in this embodiment, the peripheral portion 4A of the first electrode 4 and the peripheral portion (end portion) 13A of the edge cover layer 13 each have the pattern shape formed along the shape of the circumference of each recessed portion 9 as viewed from above, but the peripheral portion 4A and the peripheral portion 13A may each have a rectangular shape in a plan view formed along the sub-pixel region as illustrated in FIG. 4B. In FIGS. 4A and 4B, solid lines indicate the recessed portions 9 (boundaries between the filling layer 12 and the reflective layer 3); a dashed line indicates the peripheral portion 4A of the first electrode 4; and a dotted/dashed line indicates the peripheral portion 13A of the edge cover layer 13.

The organic layer 5 is formed in the light emission area U. The organic layer 5 is formed on the plurality of recessed portions 9 and is layered on the plurality of recessed portions 9 along the upper face of the first electrode 4. The organic layer 5 is a layered body including an organic material including a hole injecting layer, a hole transport layer, a light emitting layer, an electron transport layer and an electron injecting layer. A lower face of the organic layer 5 is positioned lower than the plane Q including the upper face 3a of the reflective layer 3. A configuration and a function of each layer constituting the organic layer 5 will be described below in detail.

The second electrode 6 is layered on the organic layer 5 along an upper face of the organic layer 5. In the case of this embodiment, the second electrode 6 is, for example, a translucent electrode including a vapor deposition film made of magnesium silver (MgAg) having a film thickness of 1 nm and silver (Ag) having a film thickness of 19 nm, and the second electrode 6 is transflective. The second electrode 6 functions as a negative electrode to inject electrons into the organic layer 5. Note that a transparent electrode including a transparent conductive film such as Indium Tin Oxide (ITO) and Indium Zinc Oxide (IZO) may be used as the second electrode 6. In this case, an ITO film, for example, is formed at a film thickness of 70 nm.

In this embodiment, in the light emission area U where the recessed portions 9 in the sub-pixels 11 are formed, a region sandwiched between the first electrode 4 and the second electrode 6 constitutes a microcavity structure. Light emitted from the light emitting layer undergoes multiple reflection between the first electrode 4 and the second electrode 6. At this time, specific wavelength components of the light emitted from the light emitting layer are intensified. In addition, although not illustrated in FIGS. 5 to 7, an optical adjustment layer referred to as a cap layer is layered on an upper face of the second electrode 6. Note that when the second electrode 6 is a transparent electrode, the cap layer described above may not be provided.

Figure 8:
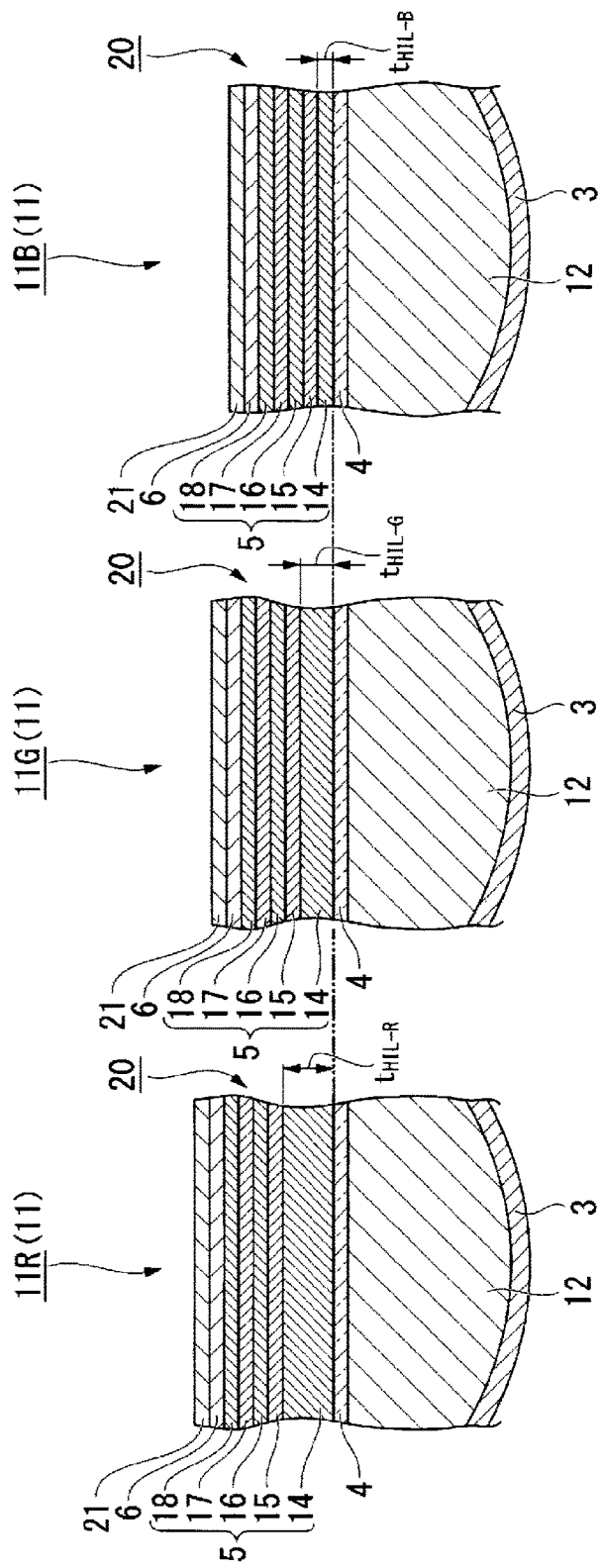
FIG. 8 is a cross-sectional view illustrating details of the recessed portion structure.

FIG. 8 is a cross-sectional view illustrating details of a recessed portion structure.

Here, an enlarged view of a structure of one of the plurality of recessed portions constituting the organic EL element 30 is illustrated. In addition, the recessed portion structures of the organic EL elements 30 of the three sub-pixels 11R, 11G and 11B differ only in the film thickness of the hole injecting layer and are common in a basic configuration.

As illustrated in FIG. 8, in the recessed portion structure (light extraction structure), the organic layer 5 is provided on an upper layer of the first electrode 4. The organic layer 5 includes a layered film including a hole injecting layer 14, a hole transport layer 15, a light emitting layer 16, an electron transport layer 17 and an electron injecting layer 18 layered one on another from the first electrode 4 side.

However, the layers other than the light emitting layer 16 may be inserted appropriately as necessary. In addition, a single layer may serve as both the transport layer and the injecting layer. In this embodiment, as described above, the organic layer having a 5-layer structure of the hole injecting layer 14, the hole transport layer 15, the light emitting layer 16, the electron transport layer 17 and the electron injecting layer 18 is described as an example. Further, as necessary, a layer for preventing migration of charge to the opposite side electrode, such as a hole blocking layer and an electron blocking layer, may be added appropriately.

The hole injecting layer 14 is a layer functioning to increase hole injection efficiency from the first electrode 4 to the light emitting layer 16. For example, benzine, styrylamine, triphenylamine, porphyrin, triazole, imidazole, oxadiazole, polyarylalkane, phenylene diamine, arylamine, oxazole, anthracene, fluorenone, hydrazone, stilbene, triphenylene, azatriphenylene, or derivatives thereof; or heterocyclic conjugated monomers, oligomers, polymers or the like of an polysilane-based compound, a vinylcarbazole-based compound, a thiophene-based compound, an aniline-based compound or the like is used as the material of the hole injecting layer 14. Molybdenum oxide is mixed with these organic materials. A mixing ratio of the organic material and the molybdenum oxide is a ratio of, for example, approximately 80% organic material and approximately 20% molybdenum oxide.

The hole transport layer 15 is a layer functioning to increase hole transport efficiency from the first electrode 4 to the light emitting layer 16. An organic material similar to the material of the hole injecting layer 14 is used for the hole transport layer 15. Note that the hole injecting layer 14 and the hole transport layer 15 may be formed as a single body or may be formed as individual layers.

The light emitting layer 16 functions to emit light when holes injected from the first electrode 4 side recombine with electrons injected from the second electrode 6 side and the holes and the electrons release energy. A material of the light emitting layer 16 includes, for example, a host material and a dopant material. Further, the material of the light emitting layer 16 may include an assist material. The constituent materials of the light emitting layer 16 include the host material at the highest ratio. For example, a mixing ratio of the host material and the dopant material is a ratio of approximately 90% host material and approximately 10% dopant material. The host material functions to facilitate film formation of the light emitting layer 16 and to maintain the light emitting layer 16 as a film. Accordingly, the host material is desirably a stable compound that does not easily crystallize after film formation and does not easily undergo chemical change. In addition, when an electrical field is applied between the first electrode 4 and the second electrode 6, recombination of carriers occurs within host molecules, and the host material functions to transfer excitation energy to the dopant material to cause the dopant material to emit light. The light emitting layer 16 has a thickness of, for example, approximately 60 nm.

Specific examples of the material of the light emitting layer 16 include materials including a material having high light emitting efficiency, such as a low molecular weight fluorescent colorant, a fluorescent polymer and a metal complex. Examples of the material of the light emitting layer 16 include anthracene, naphthalene, indene, phenanthrene, pyrene, naphthacene, triphenylene, anthracene, perylene, picene, fluoranthene, acephenanthrylene, pentaphene, pentacene, coronene, butadiene, coumarin, acridine, stilbene or derivatives thereof; tris(8-quinolinolato)aluminum complex; bis(benzoquinolinolato)beryllium complex; tri(dibenzoylmethyl)phenanthroline europium complex; and ditoluylvinylbiphenyl.

The electron transport layer 17 functions to increase electron transport efficiency from the second electrode 6 to the light emitting layer 16. For example, quinoline, perylene, phenanthroline, bisstyryl, pyrazine, triazole, oxazole, oxadiazole, fluorenone or derivatives and metal complexes thereof is used as a material of the electron transport layer 17. Specifically, for example, tris(8-hydroxyquinoline)aluminum, anthracene, naphthalene, phenanthrene, pyrene, anthracene, perylene, butadiene, coumarin, acridine, stilbene, 1,10-phenanthroline, or derivatives and metal complexes thereof is used. The electron transport layer 17 has a thickness of, for example, approximately 15 nm.

The electron injecting layer 18 functions to increase electron injection efficiency from the second electrode 6 to the light emitting layer 16. For example, a compound such as calcium metal (Ca) and lithium fluoride (LiF) is used as a material of the electron injecting layer 18. Note that the electron transport layer 17 and the electron injecting layer 18 may be formed as a single body or may be formed as individual layers. The electron injecting layer 18 has a thickness of, for example, approximately 0.5 nm.

A microcavity structure 20 has an effect of intensifying light of a specific wavelength by utilizing resonance of light occurring between the first electrode 4 and the second electrode 6. In the case of this embodiment, wavelengths of light emitted from the red, green and blue sub-pixels 11R, 11G and 11B differ from one another. Therefore, the optical path length between the first electrode 4 and the second electrode 6 corresponds to a light emission spectrum peak wavelength of each color. Each optical path length is set such that the optical path length of the red sub-pixel 11R is the longest, the optical path length of the blue sub-pixel 11B is the shortest, and the optical path length of the green sub-pixel 11G is an intermediate length between the longest and the shortest.

There are various techniques of varying each of the optical path lengths of the microcavity structure 20 for each of the sub-pixels 11R, 11G and 11B. Here, a technique of varying the thickness of the hole injecting layer 14 is employed from the perspective of minimizing an effect on resistance. A relationship tHIL-R>tHIL-G>tHIL-B holds, where the thickness of the hole injecting layer 14 of the red sub-pixel 11R is defined as tHIL-R, the layer thickness of the hole injecting layer 14 of the green sub-pixel 11G is defined as tHIL-G, and the layer thickness of the hole injecting layer 14 of the blue sub-pixel 11B is defined as tHIL-B.

Owing to the microcavity structure 20, light emitted from the organic layer 5 is repeatedly reflected between the first electrode 4 and the second electrode 6 within a prescribed optical length range, and light of a specific wavelength corresponding to the optical path length resonates and is intensified, while light of wavelengths not corresponding to the optical path length is weakened. As a result, a spectrum of light extracted to the outside becomes steep and high in intensity, and luminance and color purity are enhanced.

Alternatively, the same light emitting material emitting white light may be used in all of the light emission areas U of the red sub-pixel 11R, the green sub-pixel 11G and the blue sub-pixel 11B. Even in this case, light of wavelengths differing depending on the respective sub-pixels 11R, 11G and 11B resonates and is amplified. As a result, red light is emitted from the red sub-pixel 11R, green light is emitted from the green sub-pixel 11G, and blue light is emitted from the blue sub-pixel 11B.

A cap layer 21 is layered on the upper face of the second electrode 6. The cap layer 21 functions as a protective layer to protect the second electrode 6, and functions as an optical adjustment layer. Note that a color filter may be added on an upper-layer side of the second electrode 6. The color filter transmits light emitted from the organic layer 5, and thus color purity can increase.

A specific configuration example of the organic EL device 100 is given in Table 1.

TABLE 1

|  | Green |
| --- | --- |
| IZO: 120 nm | IZO: 120 nm |
| HIL | 70 nm |
| Organic HTL material (80%):MoOx (20%) |  |
| HTL organic HTL material | 10 |
| EML | H (90%):d (10%) |
|  | 60 nm |
|  | H: bipolar material |
|  | d: phosphorescent material |
| ETL organic ETL material | 15 nm |
| EIL LiF | 0.5 nm |
| Cathode (translucent electrode) | MgAg 1 nm/Ag 19 nm |
| Cap layer | 78 nm |

A production process for the organic EL device including the above configuration will be described below.

FIGS. 9A to 9D and FIGS. 10A to 10C each illustrate a production process for the organic EL device of the first embodiment.

First, the TFT array substrate 101 is formed.

Figure 9A:
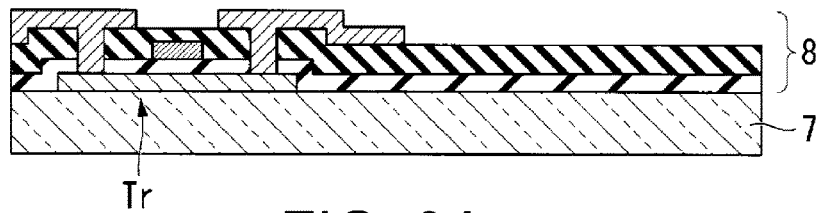
FIG. 9A is a first view illustrating a production process for the organic EL device of the first embodiment.

As illustrated in FIG. 9A, a TFT layer 8 including a thin film transistor Tr or the like is formed on the base material 7. The thin film transistor Tr is formed by using a known method and is not particularly limited.

Figure 9B:
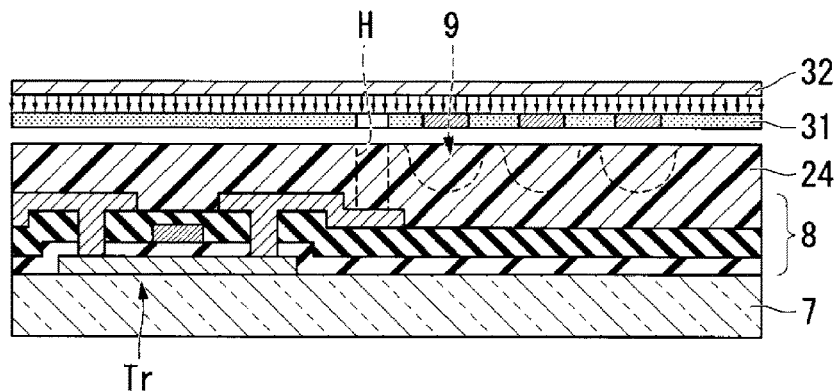
FIG. 9B is a second view illustrating the production process for the organic EL device of the first embodiment.

Next, as illustrated in FIG. 9B, a film of silicon nitride is formed as a resin film 24 on the thin film transistor Tr by known CVD method to obtain the film thickness of 500 nm.

Here, the substrate illustrated in FIG. 9A is immersed for two minutes in an ultrasonic washing tank of pure water, blow-dried with N2, and dried in an atmospheric oven at 150° C. Subsequently, a photosensitive acrylic resin (for example, JAS100, available from JSR) is applied onto the base material 7 by a spin coating method at a revolution speed of 1000 rpm and a revolution time of 10 seconds, and is pre-baked for two minutes with a hot plate at 150° C.

Next, the resin film 24 is exposed to form a prescribed pattern by using a photomask 31 with a UV exposure device 32. The exposure time is one second. In this embodiment, a mask in which a pattern having a diameter of 4 μm is disposed at a pitch of 7 μm is used. Finally, the recessed portion structure assumes a pattern having a diameter of approximately 5 μm due to a pattern shift. In addition, a portion of the photomask 31 corresponding to a contact hole H connected to TFT wiring line is completely opened in the film thickness direction. In addition, a portion of the photomask 31 corresponding to the recessed portion structure serves as an opening for half-exposure having a transmittance of 15%.

Figure 9C:
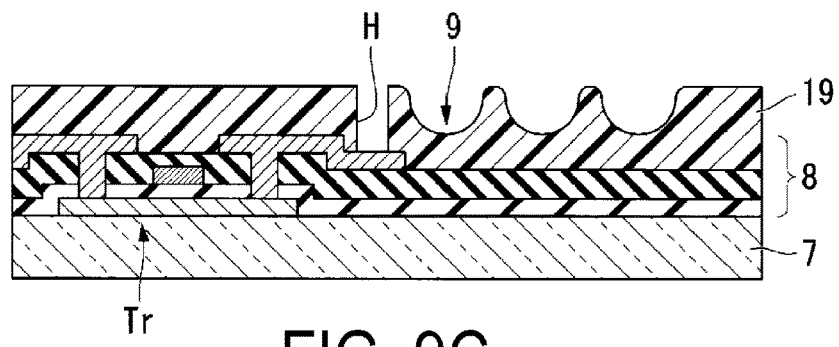
FIG. 9C is a third view illustrating the production process for the organic EL device of the first embodiment.

Subsequently, development is carried out with an alkaline developing solution having a concentration of a few %. Specifically, immersion for two minutes in 0.1% tetraammonium hydroxide (TMAH) and washing with water are carried out, and a prescribed pattern as illustrated in FIG. 9C is obtained. Subsequently, baking in an atmospheric oven at 200° C. is carried out for 60 minutes.

Thus, the flattening resin layer 19 including the plurality of recessed portions 9 for each sub-pixel 11 is obtained.

A portion of a drain electrode 15d of the thin film transistor Tr is exposed through each contact hole H.

Next, the organic EL element 30 is formed in each of the plurality of recessed portions 9 provided for each sub-pixel 11 on the flattening resin layer 19.

Figure 9D:
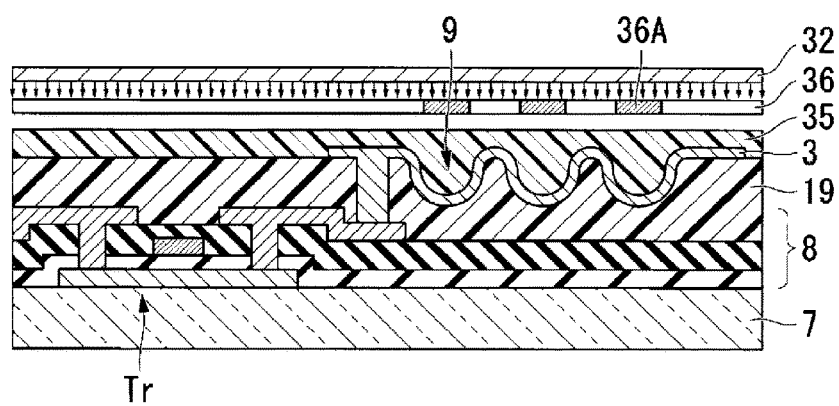
FIG. 9D is a fourth view illustrating the production process for the organic EL device of the first embodiment.

First, as illustrated in FIG. 9D, the reflective layer 3 is formed on the plurality of recessed portions 9 formed on the flattening resin layer 19. The reflective layer 3 is obtained by forming a film of aluminum (Al) having a thickness of 100 nm, and by forming the film into a prescribed pattern by a known method. After the film of Al having a thickness of 100 nm is formed by a known sputtering method and a photoresist is applied, exposure development is carried out followed by etching for 2 minutes with a phosphoric acid-based etching solution. Subsequently, the resist is removed with a stripping solution. As a result, the reflective layer 3 is formed for each sub-pixel 11.

Here, the reflective layer 3 is preferably formed to have a size including the sub-pixel region and formed to reach a periphery of the sub-pixel region.

Next, as illustrated in FIG. 9D, a photosensitive acrylic resin is applied by a spin coating method onto the flattening resin layer 19 including the reflective layer 3, and the acrylic resin layer 35 is subjected to UV exposure using a photomask 36. The acrylic resin layer 35 is formed to have a thickness of 1.0 μm at the time of completion of pre-baking.

The photomask 36 has a pattern to block light in regions corresponding to the recessed portions 9. As a result, at the time of exposure, the acrylic resin layer inside the recessed portions 9 can be prevented from being strongly exposed owing to the concentration of light in the recessed portions 9, and the filling layer can be prevented from being over-developed. Note that a half-tone mask, for example, may be used as the photomask 36. In this embodiment, the diameter of a light blocking portion 36A (black) of the photomask 36 is φ3 μm.

In addition, the acrylic resin is applied onto the substrate at a revolution speed of 1500 rpm and a revolution time of 20 seconds and is baked for two minutes with a hot plate at 150° C. In addition, the exposure time is one second.

Figure 10A:
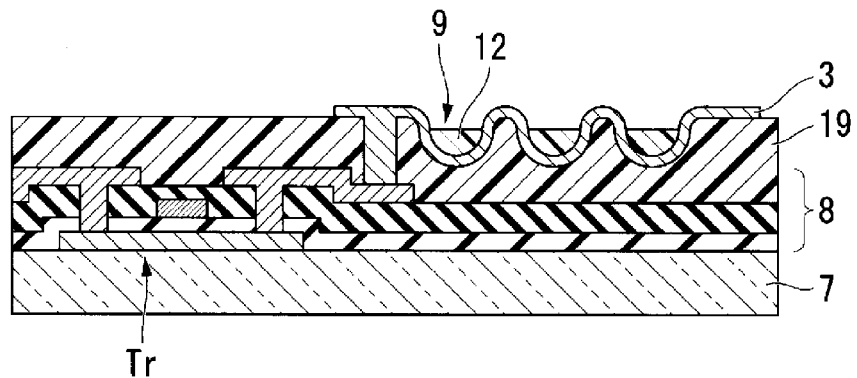
FIG. 10A is a first view illustrating the production process for the organic EL device of the first embodiment.

After the acrylic resin layer 35 is exposed, the acrylic resin layer 35 is developed for 2 minutes with an alkaline developing solution having a concentration of a few %, washed with water, and dried, and the acrylic resin layer 35 together with the base material 7 is baked in an oven at 200° C. More specifically, immersion for two minutes in 0.1% tetraammonium hydroxide (TMAH) and pattern development are carried out and followed by washing with water, and the substrate is blow-dried with N2 and baked in an oven at 200° C. Thus, the filling layer 12 is formed in each of the plurality of recessed portions 9 provided for each sub-pixel 11, and the configuration as illustrated in FIG. 10A is obtained.

Next, an Indium Zinc Oxide (IZO) film is formed as the first electrode 4 including a transparent electrode on the entire surface of the substrate to cover the reflective layer 3 with a thickness of 120 nm. That is, an IZO film is formed with a thickness of 100 nm by a known sputtering method. Subsequently, after the photosensitive photoresist is applied by a spin coating method, pre-baking is completed. Pattern exposure is then carried out by using a photomask having a prescribed pattern and by using an UV exposure device, and after the photoresist is developed, the photoresist is etched for 2 to 4 minutes with oxalic acid. Subsequently, the photoresist is removed with a stripping solution, washed with water, and dried. In this embodiment, patterning is carried out such that the peripheral portion 4A of the first electrode 4 is located inside the recessed portions 9. The peripheral portion 4A is located at a distance from the reflective layer 3 positioned directly beside the first electrode 4 (extending in the horizontal direction) inside the recessed portions 9, and is not in contact with the reflective layer 3.

The reflective layer 3 and the first electrode 4 are electrically connected to each other in an overlapping portion on the upper face 19a of the flattening resin layer 19. The reflective layer 3 is electrically connected to a drive circuit such as TFT wiring line through the contact hole H outside the display region, and as a result, each sub-pixel 11 can emit light in a prescribed manner.

Figure 10B:
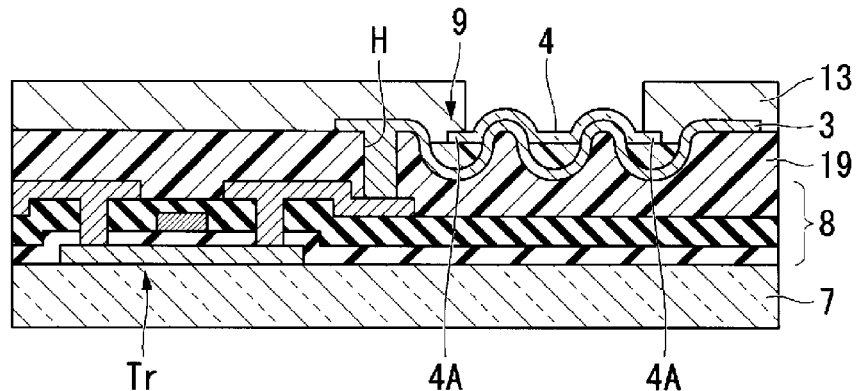
FIG. 10B is a second view illustrating the production process for the organic EL device of the first embodiment.

Next, an acrylic resin film serving as the edge cover layer 13 to cover the end portions of the first electrode 4 is formed on the flattening resin layer 19. That is, a film of an acrylic resin is formed by a spin coating method to have a thickness of 2 μm at the time of completion of pre-baking. This resin film is subjected to pattern exposure with a photomask having a prescribed pattern and with an UV exposure device, and is developed with an alkaline developing solution having a concentration of a few %. Subsequently, after the film is washed with water and dried, the film is baked for 1 hour in an oven at 200° C. As a result, the edge cover layer 13 as illustrated in FIG. 10B is formed. In this case, the edge cover layer 13 is formed and patterned to cover the peripheral portion 4A of the first electrode 4 located inside the recessed portions 9.

In this embodiment, the sub-pixel region (light emission area) is defined by the edge cover layer 13.

Figure 10C:
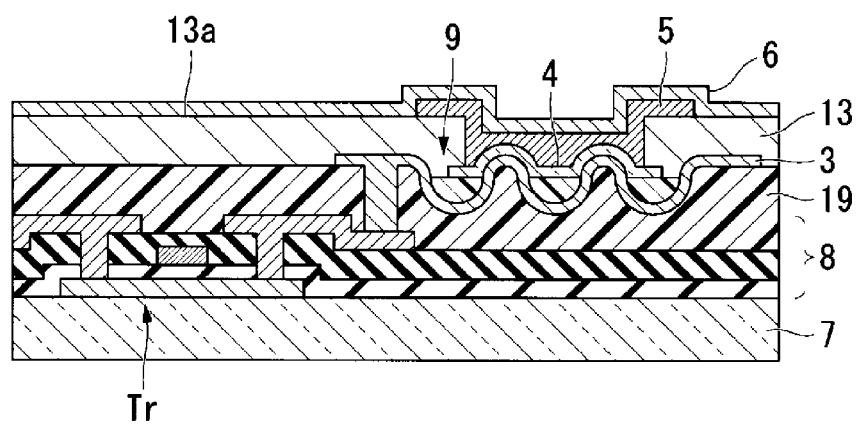
FIG. 10C is a third view illustrating the production process for the organic EL device of the first embodiment.

Next, as illustrated in FIG. 10C, the organic layer 5 is formed to include the configuration as given in Table 1 above.

Finally, a vapor deposition film including magnesium silver (MgAg) having a film thickness of 1 nm and silver (Ag) having a film thickness of 19 nm is formed on the upper face 13a of the edge cover layer 13 to cover the organic layer 5 formed for each sub-pixel 11, and the second electrode 6 is formed. Thus, a plurality of the organic EL elements 30 are formed for each sub-pixel 11.

The organic EL device 1 of this embodiment is completed by the process described above.

Figure 11A:
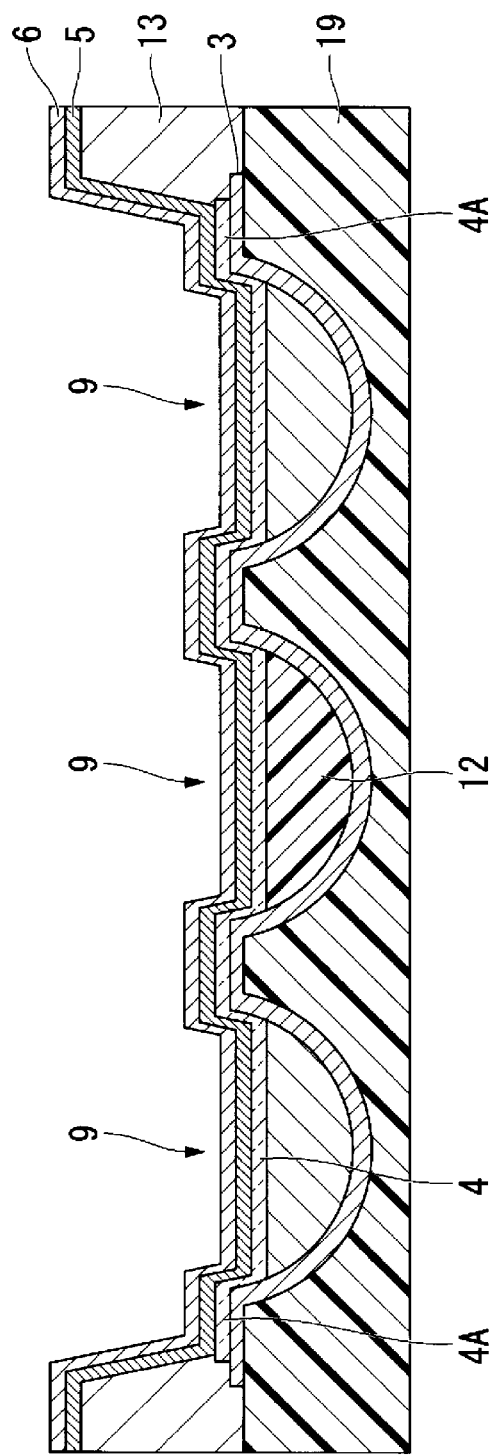
FIG. 11A is a view illustrating an optical path in a configuration of the related art.
Figure 11B:
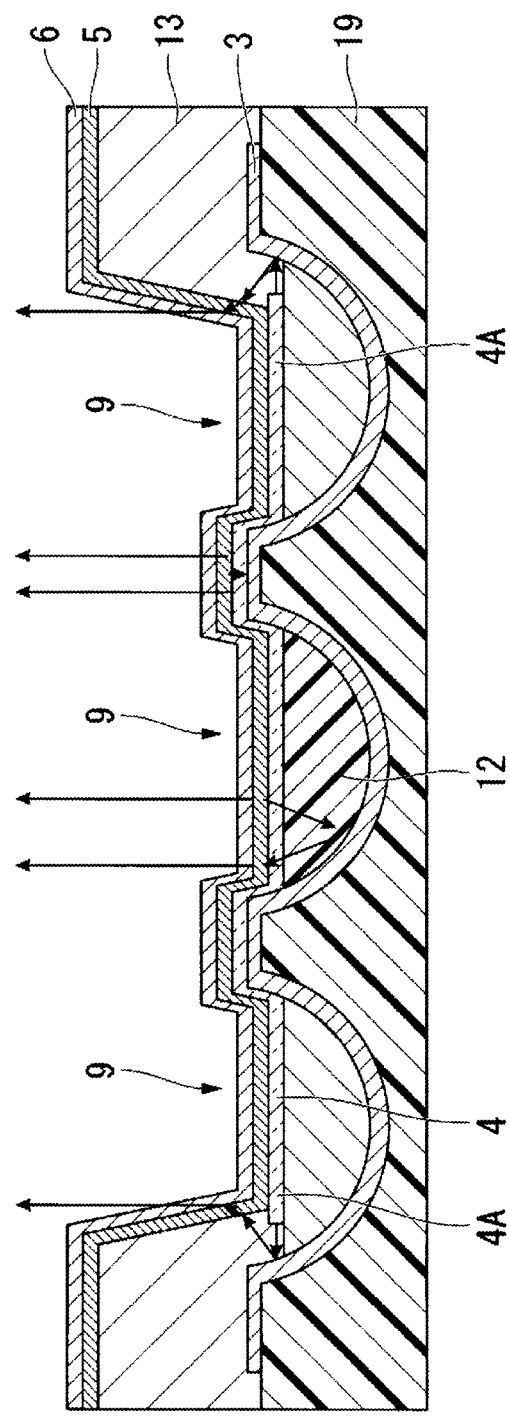
FIG. 11B is a view illustrating an optical path in a configuration of an embodiment.

FIG. 11A is a view illustrating an optical path in a configuration of the related art, and FIG. 11B is a view illustrating an optical path in the configuration of this embodiment.

As illustrated in FIG. 11A, a component emitting light in the organic layer 5 is guided within the recessed portions 9 and reflected by the reflective layer 3 to cause the advancing direction to bend, and the component is emitted to the display surface side to a certain degree. However, since refractive indices of the organic layer 5 and the first electrode 4 are similar, there are many luminescent components propagating the first electrode 4. Owing to an inclination effect of inner faces of the recessed portions 9, some of the luminescent components can be extracted to the display surface side, but as illustrated in FIG. 11A, the luminescent components become edge luminescent components at the peripheral portion 4A of the first electrode 4, and there are many luminescent components dispersed into films such as the edge cover layer 13.

In contrast, in the configuration of this embodiment, as illustrated in FIG. 11B, luminescent components discharged from the end portions (edges) of the first electrode 4 are extracted to the display surface side by utilizing the inner faces of the recessed portions 9. As a result, since luminescent components that cannot be extracted in the related art can be extracted to the outside, light emitting efficiency is enhanced. As a result, a display having even lower power consumption can be constituted.

Figure 12:
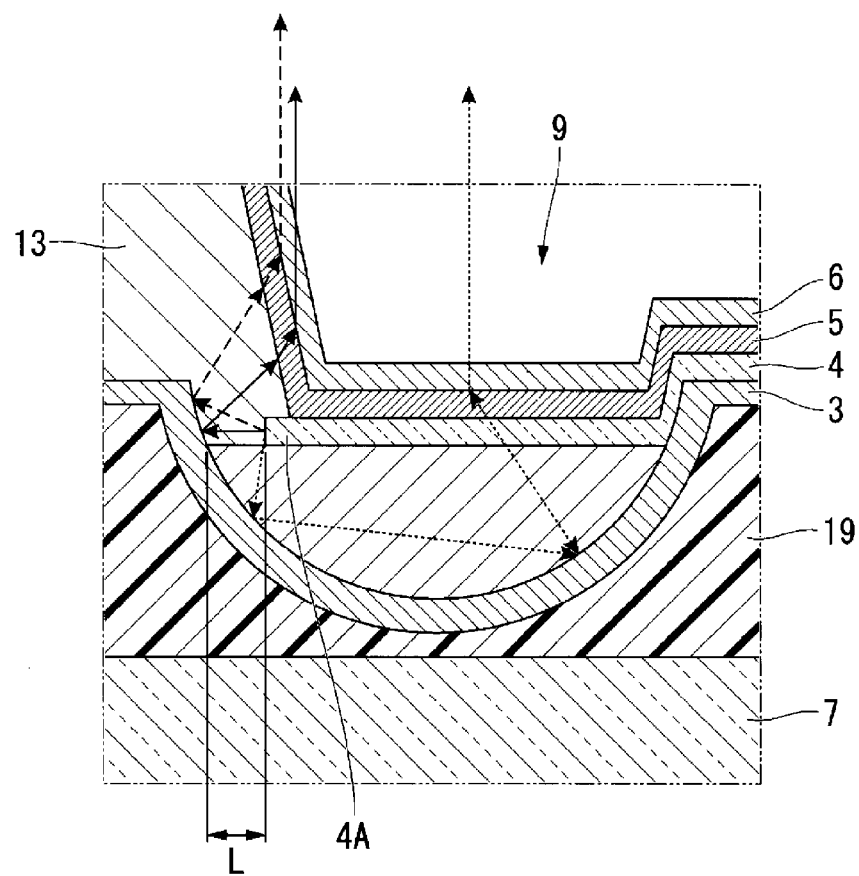
FIG. 12 is a view illustrating an optical path near one recessed portion structure in a sub-pixel.

FIG. 12 is a view illustrating an optical path near one recessed portion structure in a sub-pixel.

As illustrated in FIG. 12, in this embodiment, the reflective layer 3 and the peripheral portion 4A of the first electrode 4 are located at a distance from each other in the recessed portion structure. In this embodiment, the peripheral portion 4A and the reflective layer 3 are formed such that a distance L between the peripheral portion 4A and the reflective layer 3 within the same plane as the peripheral portion 4A is 2 μm. As a result, luminescent components emitted from the peripheral portion 4A can be extracted efficiently to the display surface side.

Note that when the peripheral portion 4A of the first electrode 4 and the reflective layer 3 are in contact with each other within the recessed portion 9, a high proportion of light emitted in the horizontal direction from the peripheral portion 4A is reflected back into the first electrode 4 by the reflective layer 3, and the emitted light cannot be extracted efficiently.

Figure 13:
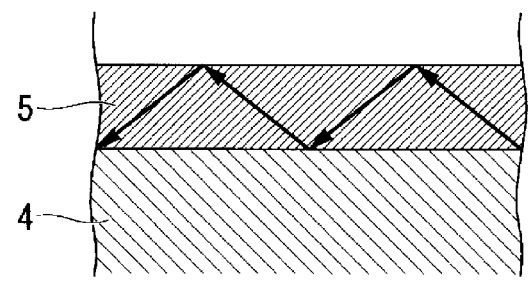
FIG. 13 is a view illustrating a relationship between a refractive index and an optical path.

FIG. 13 is a view illustrating a relationship between a refractive index and an optical path.

As illustrated in FIG. 13, owing to the relationship of the refractive index, luminescent components sealed in the organic layer 5 between an air layer and the reflective layer 3 cannot be extracted to the display surface side. As described above, since luminescent components from the organic EL element 30 emit light evenly in all directions, some components emitting light within the light emitting layer are completely reflected owing to a difference in refractive index between the organic layer 5 and air. Therefore, the components cannot be extracted to the outside, and continue to scatter while moving in the lateral direction within the organic layer 5. Solid arrows in FIG. 13 represent a concept of luminescent components. In addition, in the light emission area (planar region) in the recessed portion 9 of the recessed portion structure, a layered structure including an air layer/organic EL layer/transparent resin layer/reflective layer is established, but even in this case, there are many luminescent components emitted in the lateral direction from the first electrode 4.

Figure 14:
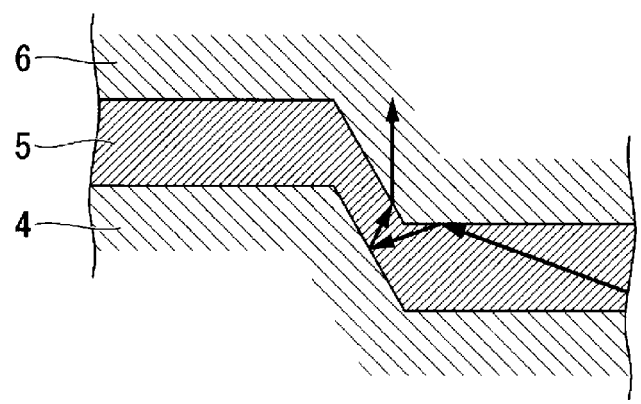
FIG. 14 is a view illustrating an optical path in the recessed portion structure.

FIG. 14 is a view illustrating an optical path in the recessed portion structure.

As illustrated in FIG. 14, inside the sub-pixel 11, the direction of light of a luminescent component is altered in the inclined portions of the recessed portion structure, and emitted light can also be extracted to the display surface side. However, there are still many components of light scattering in the film surface direction of the first electrode 4.

In contrast, in this embodiment, light discharged in the lateral direction (horizontal direction) from a pattern end of the first electrode 4 of the organic EL element 30, that is, from the peripheral portion 4A, can be extracted to the display surface side by the reflective layer 3 having the shape of the recessed portion. As a result, efficiency of extracting light emitted from the light emission area of the organic EL element 30 to the outside can be increased, and as a result, a display having low power consumption can be constituted.

To verify the advantageous effects of the organic EL element (recessed portion structure) of this embodiment, the present inventors produced two types of organic EL elements and compared characteristics of the two types of organic EL elements. Here, green light emitting elements having high color purity were produced. In addition, measurements were carried out from the front face side of the element to clearly analyze phenomena of each element. The results are given in Table 2.

In an example, the above-described organic EL element including the light extraction structure (MS structure) for extracting light from the edge portion of the first electrode 4 is used.

In a comparative example, an element (BE element) exhibiting no light extraction effect of extracting light from the edge portion of the first substrate 4 and no microcavity effect is used.

TABLE 2

(Results of observation of front face luminance)

|  | Example | Comparative example |
|---|---|---|
| Current efficiency | 1.4 | 1 |

As shown in Table 2, it has been found that when current efficiency of the organic EL element of the comparative example is used as a reference, current efficiency of the organic EL element of the example is approximately 1.4 times higher than in the comparative example.

Thus, it has been found that in the organic EL element of the example, luminance efficiency can be dramatically improved owing to the light extraction structure for extracting light from the edge portion of the first electrode 4. Here, the green light emitting elements were produced, but the same results can also be obtained with elements emitting light of other colors. That is, according to the light extraction structure described above, high luminance can be obtained without any limitation on the luminescent color.

As described above, according to the configuration of this embodiment, luminous current efficiency can be improved by providing the recessed portion shape on the TFT array substrate 101 side and extracting luminescent components propagating the transparent lower electrode (first electrode 4) in the film surface direction to the display surface side.

Second Embodiment

Next, an organic EL device of a second embodiment of the disclosure will be described.

A basic structure of the organic EL device of this embodiment described below is roughly the same as the basic structure of the first embodiment described above, but differs with regard to a recessed portion structure. Therefore, in the following description, differences from the first embodiment will be described in detail, and description of parts in common will be omitted. In addition, in each of the drawings for the description, components common in FIGS. 1 to 14 are given the same reference signs.

Figure 15:
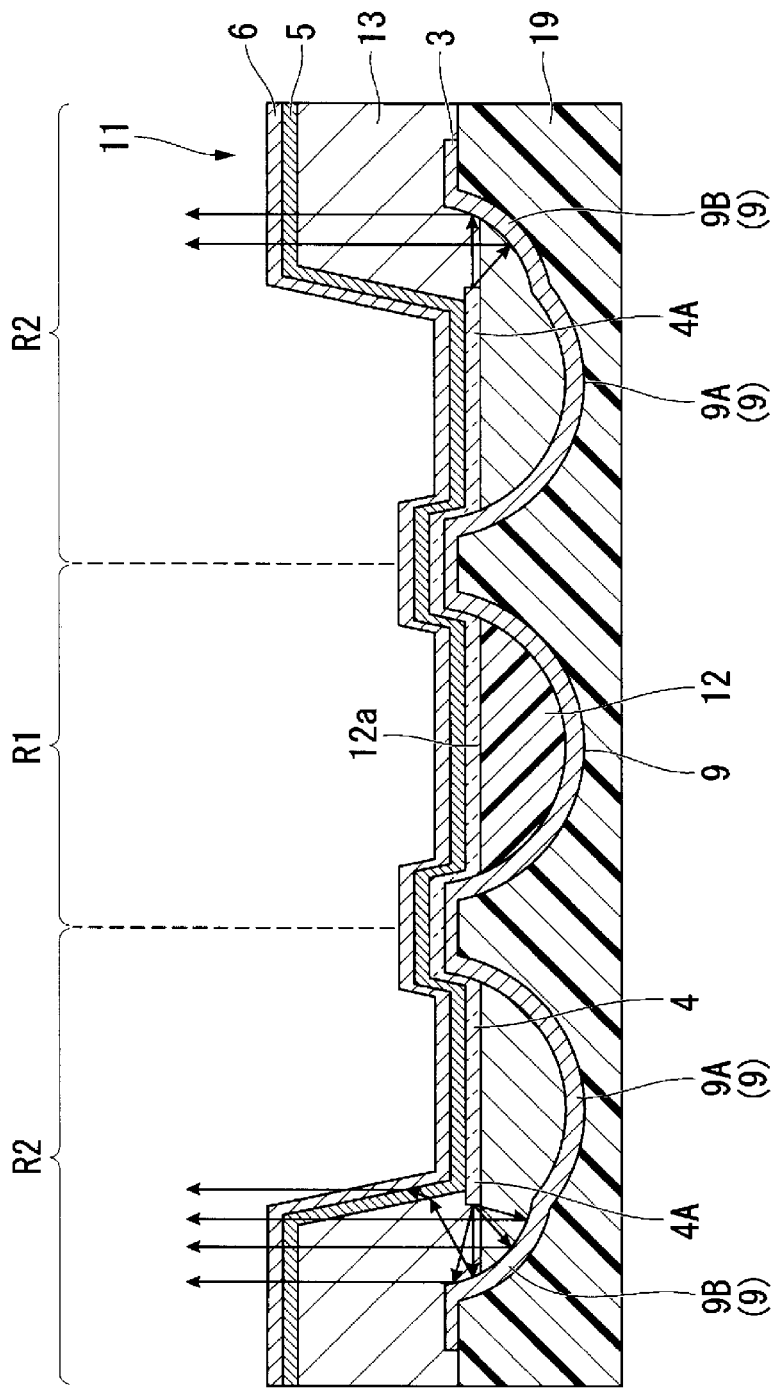
FIG. 15 is a view illustrating a recessed portion structure in a sub-pixel of an organic EL device of a second embodiment.

FIG. 15 is a view illustrating a recessed portion structure in a sub-pixel of the organic EL device of the second embodiment.

As illustrated in FIG. 15, in this embodiment, a peripheral portion of the recessed portion structure in a sub-pixel 11 has a parabola shape. Specifically, among a plurality of recessed portions 9 located in the sub-pixel 11, a recessed portion (second recessed portion) 9B having a parabola shape in a cross-sectional view is provided adjacent to a recessed portion 9A in a peripheral portion of the recessed portion 9A positioned in a peripheral region R2. A reflective layer 3 and a filling layer 12 common to the recessed portion 9A are provided in the recessed portion 9B, but a first electrode 4 is not located. That is, in this embodiment, the recessed portion structure is a structure where a peripheral portion 4A of the first electrode 4 is located at a distance from the reflective layer 3 in the recessed portion 9B.

Note that as long as the recessed portion structure is a structure where the peripheral portion 4A of the first electrode 4 is located at a distance from the reflective layer 3 in the recessed portion 9B, the first electrode 4 may be located in the recessed portion 9B.

The parabola shape of the recessed portion 9B is formed such that the peripheral portion 4A of the first electrode 4 is used as a focal point. As a result, light scattering in the lateral direction in an organic layer 5 between the first electrode 4 and a second electrode 6 can also be extracted to the outside, and luminous current efficiency can be further improved.

In the case of this embodiment, the reflective layer 3 is formed along an inner face of the recessed portion 9B having a parabola shape.

Therefore, an inner face of the reflective layer 3 also has a parabola shape. In addition, the recessed portion 9B is positioned on the outside of the recessed portion 9A, and the first electrode 4 is not located on an upper face 12A of the filling layer 12.

Figure 16:
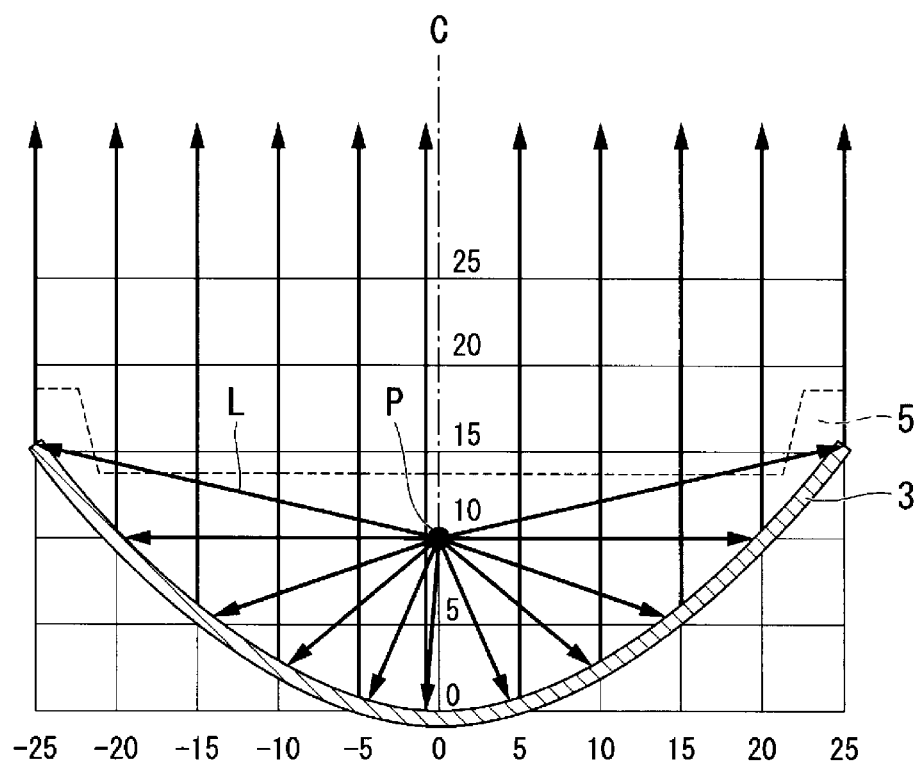
FIG. 16 is a view illustrating a concept of a parabola shape.

FIG. 16 is a view illustrating a concept of the parabola shape.

As illustrated in FIG. 16, in the organic layer 5, light L emitted from a light-emission point P positioned at a focal point of a parabolic line in a cross-sectional shape of the recessed portion 9B is reflected by the reflective layer 3, and then advances in a direction parallel to a central axis C of the parabolic line, that is, a direction orthogonal to an interface with outside space of the organic EL device. Although the light L is emitted from the light-emission point P in every direction, regardless of the direction in which the light L is emitted, the light L is reflected by the reflective layer 3 and then advances in the direction parallel to the central axis C of the parabolic line.

The shape according to a parabola theory has a cross-sectional shape of $Y=aX^2$. In addition, as illustrated in FIG. 16, the focal point position in this case is known to be $\{0, 1/(4a)\}$, and the peripheral portion 4A of the first electrode 4 of the organic EL element is constituted in a region including this focal point position.

Some light emitted from the organic EL element is emitted directly to the outside from a light emission area, but occupies only approximately 20% of the original light emission in an ordinary structure.

In contrast, in this embodiment, light discharged from the peripheral portion 4A of the first electrode 4 of the organic EL element is reflected by the reflective layer 3 in the recessed portion 9B having a parabola shape and is extracted to the display surface side. As a result, efficiency of extracting light emitted from the light emitting layer of the organic EL element to the outside can be increased, and there is no light emission area having low efficiency. As a result, a display having low power consumption can be constituted.

Figure 17:
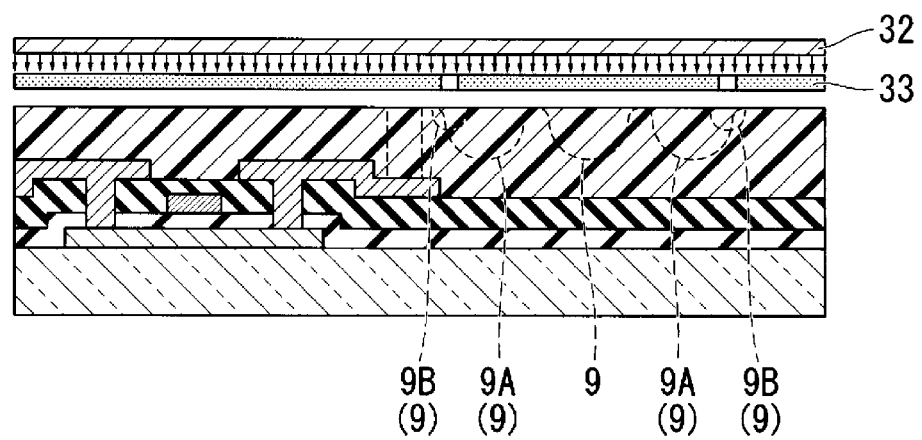
FIG. 17 is a view for explaining a production method for the recessed portion structure of the second embodiment.

FIG. 17 is a view for explaining a production method for the recessed portion structure of the second embodiment.

As illustrated in FIG. 17, the ordinary recessed portions 9 and the recessed portions 9B each having a parabola shape can be formed by exposing a photosensitive flattening resin layer through prescribed photomasks 33, respectively. Specifically, a photosensitive acrylic resin is first applied to a substrate, and regions corresponding to the recessed portions 9A in the resin layer are exposed by an exposure device 32 through a photomask pattern. Subsequently, a photomask pattern for forming a parabola shape is used to expose a region corresponding to the peripheral portion 4A of the first electrode 4. Here, the exposure time is 0.5 seconds.

Thus, a plurality of the recessed portions 9A and a plurality of the recessed portions 9B each having a parabola shape are formed.

Next, to verify the advantageous effects of the organic EL element (recessed portion structure) of this embodiment, the present inventors produced two types of organic EL elements, and compared characteristics of the two types of organic EL elements. Again, in this verification, green light emitting elements were produced. In addition, measurements were carried out from the front face side of the element to clearly analyze phenomena of each element. The results are given in Table 3.

In an example, an organic EL element including the recessed portion structure having a parabola shape is used.

In a comparative example, an element (BE element) exhibiting no light extraction effect of extracting light from an edge portion of the first electrode 4 and no microcavity effect is used.

TABLE 3

(Results of observation of front face luminance)

|  | Example | Comparative example |
|---|---|---|
| Current efficiency | 1.6 | 1 |

As shown in Table 3, it has been found that when current efficiency of the organic EL element of the comparative example is set to "1," current efficiency of the organic EL element of the example is approximately "1.6" times higher than in the comparative example.

Therefore, it has been found that in the organic EL element of the example, luminance efficiency can be further improved owing to the recessed portion structure having a parabola shape.

Third Embodiment

Next, an organic EL device of a third embodiment of the disclosure will be described.

A basic structure of the organic EL device of this embodiment described below is roughly the same as the basic structure of the first embodiment described above, but differs with regard to a recessed portion structure. Therefore, in the following description, differences from the first embodiment will be described in detail, and description of parts in common will be omitted. In addition, in each of the drawings for the description, components common in FIGS. 1 to 14 are given the same reference signs.

Figure 18:
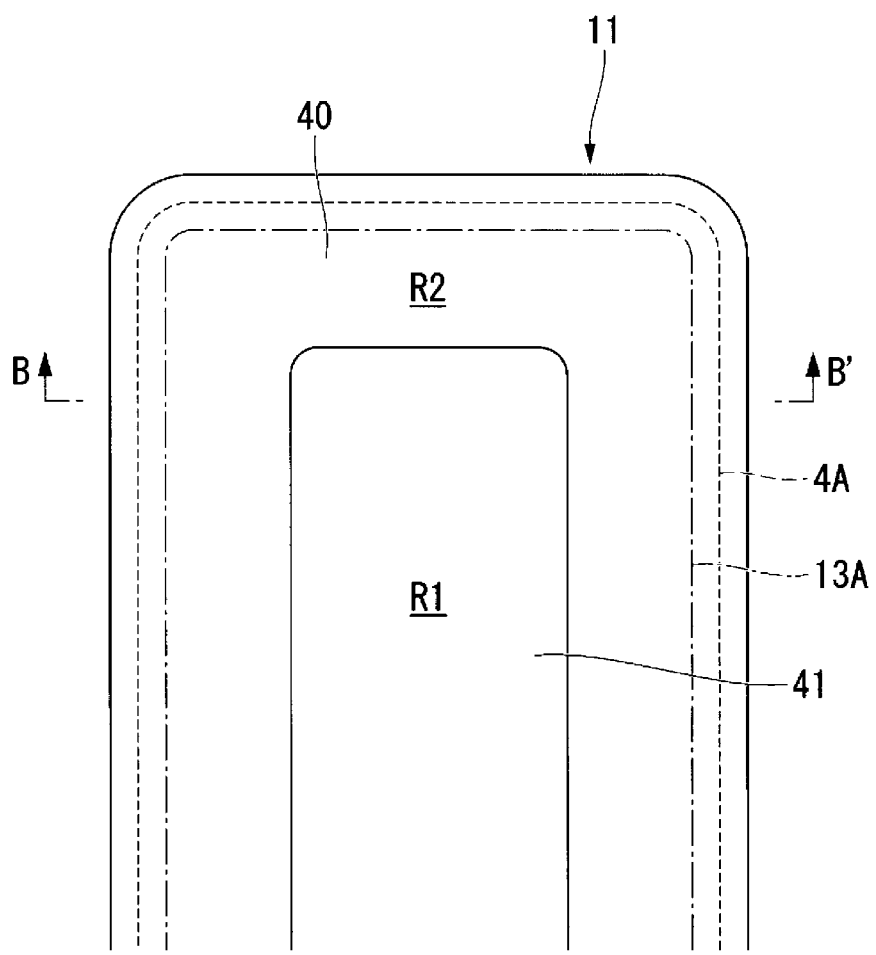
FIG. 18 is a view illustrating a planar shape in a sub-pixel of an organic EL device of a third embodiment.

FIG. 18 is a view illustrating a planar shape in a sub-pixel of an organic EL device of a third embodiment.

Figure 19:
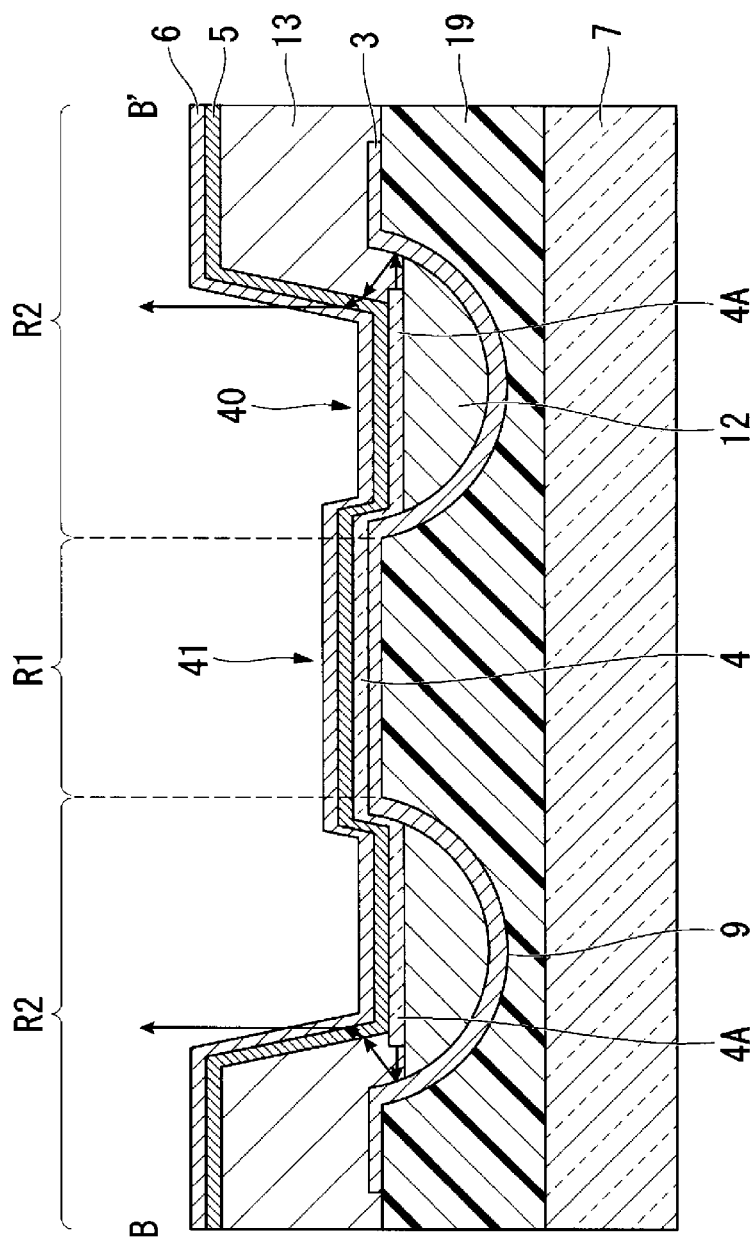
FIG. 19 is a cross-sectional view along line B-B' in FIG. 18.

FIG. 19 is a cross-sectional view along line B-B' in FIG. 18.

Figure 20:
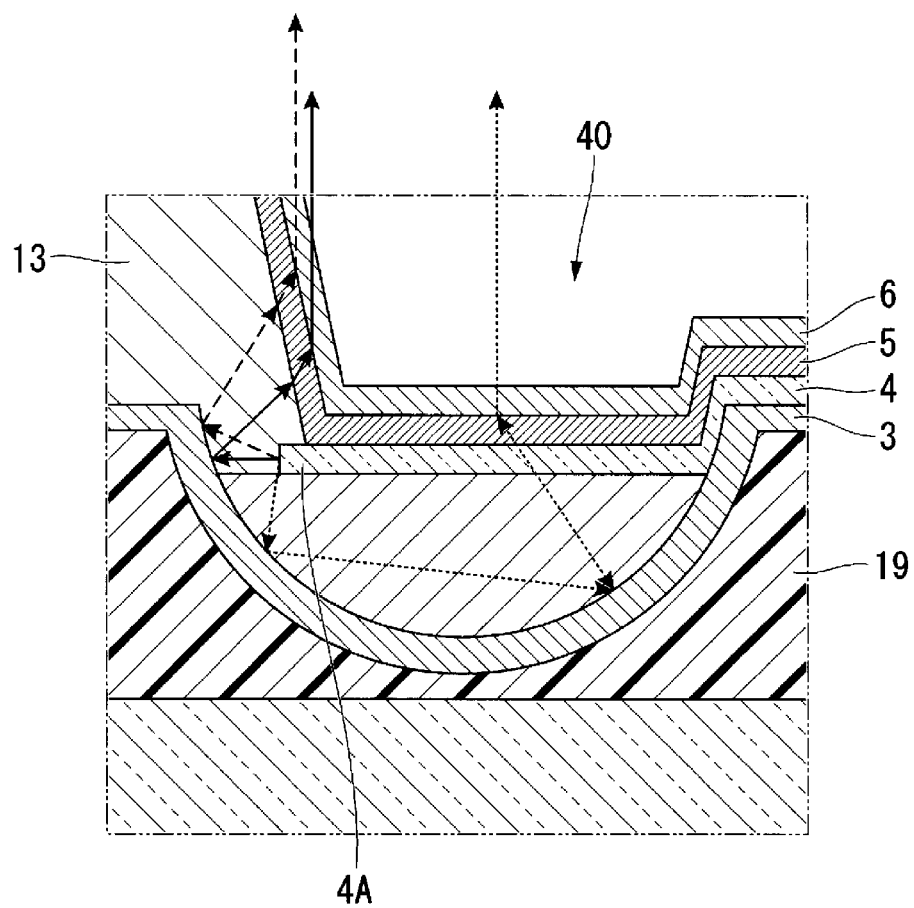
FIG. 20 is a partially enlarged cross-sectional view illustrating an optical path in the recessed portion structure.

FIG. 20 is a partially enlarged cross-sectional view illustrating an optical path in the recessed portion structure.

As illustrated in FIGS. 18 and 19, this embodiment differs from the above-described embodiments in that a recessed portion 9 is provided only in a peripheral region (second region) R2 of a sub-pixel 11 to form a recessed portion structure 40. A central region (first region) R1 of the sub-pixel 11 is formed as a smooth structure 41. As illustrated in FIG. 19, no recessed portion 9 is provided in the central region R1, and upper faces of a first electrode 4 and an organic layer 5 are formed as smooth faces. The smooth structure 41 in the central region R1 is a top-emitting structure using an ordinary microcavity.

The recessed portion structure 40 in this embodiment is a recessed portion having a semicircular cross-sectional shape, and is formed continuously in a periphery of the sub-pixel 11.

According to the configuration of this embodiment, luminescent color improvement due to the microcavity structure can be obtained in the smooth structure 41. Further, although there is no microcavity effect, in the recessed portion structure 40, luminescent components from the peripheral portion 4A of the first electrode 4 can be extracted to the display surface side.

Such a luminescent color improvement effect and a light extraction effect enable formation of an organic EL element having high efficiency and high display quality.

Here, a refractive index of IZO used as the first electrode 4 is approximately 2.0. On the other hand, a refractive index of an acrylic resin is from 1.5 to 1.6. Therefore, when an edge cover layer 13 is formed with an acrylic resin, light extraction efficiency from the peripheral portion 4A of the first electrode 4 due to the recessed portion structure 40 may decrease.

Thus, in this embodiment, the edge cover layer 13 is formed with an SiNx film having a refractive index similar to the refractive index of IZO. As a result, as illustrated in FIG. 20, light components scattering in the lateral direction (horizontal direction) from the peripheral portion 4A of the first electrode 4 can be extracted smoothly to the edge cover layer 13 side, and can be reflected by an inclined portion of the reflective layer 3 to efficiently extract light to the display surface side. Accordingly, light extraction efficiency from the peripheral portion 4A of the first electrode 4 can further increase.

Figure 21A:
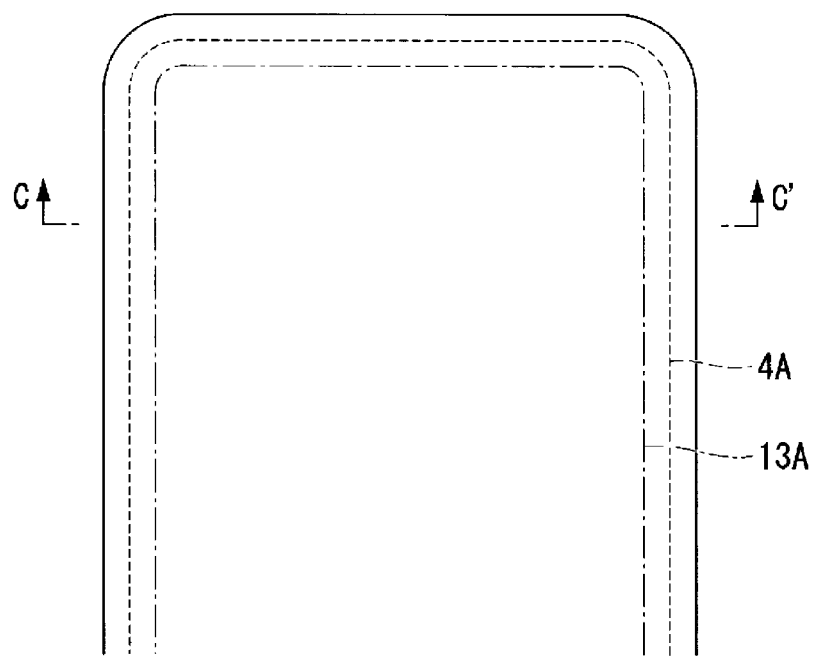
FIG. 21A is a view illustrating a recessed portion structure of the related art and is a plan view of one pixel.
Figure 21B:
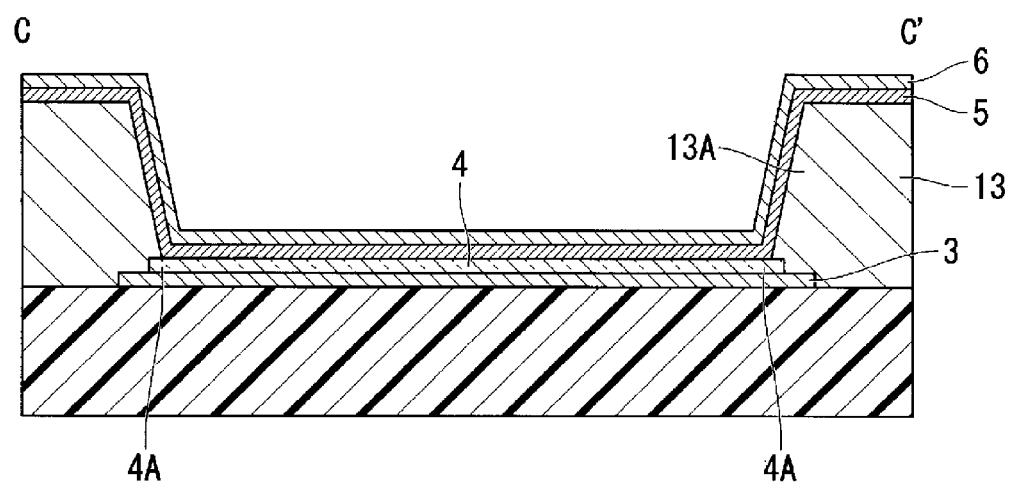
FIG. 21B is a view illustrating the recessed portion structure of the related art and is a cross-sectional view along line C-C' in FIG. 21A.

FIGS. 21A and 21B are views each illustrating a recessed portion structure of the related art. FIG. 21A is a plan view of one pixel, and FIG. 21B is a cross-sectional view along line C-C' of FIG. 21A.

As illustrated in FIGS. 21A and 21B, in the case of a top-emitting structure of the related art, since there is no recessed portion structure similar to the recessed portion structure of this embodiment described above, luminescent components leaking in the lateral direction from the peripheral portion 4A of the first electrode 4 are guided through the inside of a substrate and cannot be extracted to the outside. Although some luminescent components may be extracted to the display surface side, the luminescent components are extracted in a small amount, and scatter in a very large amount within the substrate.

To verify the advantageous effects of the organic EL element (recessed portion structure) of this embodiment, the present inventors produced two types of organic EL elements, and compared characteristics of the two types of organic EL elements. The results are given in Table 4.

In an example, the above-described organic EL element including the light extraction structure for extracting light from the edge portion of the first electrode 4 is used.

In a comparative example, an organic EL element including no light extraction structure for extracting light from the edge portion of the first electrode 4 is used.

TABLE 4

(Results of observation of front face luminance)

| Structure | | |
|---|---|---|
| | No light extraction structure for extracting light from edge | Structure of this example |
| Current efficiency | 1 | 1.5 |

As shown in Table 4, it has been found that when current efficiency of the organic EL element of the comparative example is set to "1," current efficiency of the organic EL element of the example is approximately "1.5" times higher than in the comparative example.

Therefore, it has been found that luminance efficiency can also improve in the case of the recessed portion structure of this example.

The preferred embodiments according to the disclosure are described above with reference to the attached drawings, but as a matter of course, the disclosure is not limited to these examples. It is clear that various modifications and variations can be conceived by a person skilled in the art within the scope of the technical ideas described in the claims, and it is understood that these modifications and variations also obviously fall under the technical scope of the disclosure.

INDUSTRIAL APPLICABILITY

Some aspects of the disclosure can be applied to an organic electroluminescent device, a production method for an organic electroluminescence device, an illumination device and a display device, in which it is necessary to enhance light extraction efficiency and to increase luminous current efficiency.

REFERENCE SIGNS LIST 2a, 3a, 19a, 12a, 13a Upper face
2 Substrate
3 Reflective layer
4 First electrode
5 Organic layer
6 Second electrode
7 Base material
9 Recessed portion
9A First recessed portion
9B Second recessed portion
10 Display region
11 Unit light emitting region
12 Filling layer
13 Edge cover layer
13A Peripheral portion (end portion)
16 Light emitting layer
19 Flattening resin layer
30 Organic EL element (light emitting element)
L Light
Q Plane

The invention claimed is:

1. An organic electroluminescence device comprising:
a substrate;
a flattening resin layer provided on the substrate, the flattening resin layer including one face on which a recessed portion is provided;
a reflective layer provided on at least a surface of the recessed portion;
a filling layer having optical transparency and filling a portion of an inside of the recessed portion via the reflective layer interposed between the filling layer and the recessed portion;
a first electrode having optical transparency and provided above the filling layer;
an organic layer containing at least a light emitting layer and provided on an upper layer of the first electrode;
a second electrode having optical transparency and provided above the organic layer; and
an edge cover layer that covers at least an end portion of the first electrode, and does not cover another portion of the first electrode, wherein
the another portion of the first electrode is in contact with the reflective layer at an upper face of the flattening resin layer,
an upper face of the first electrode at a position of the recessed portion is positioned below a plane including an upper face of the reflective layer, and
the end portion of the first electrode is located inside the recessed portion and at a distance from the reflective layer.

2. The organic electroluminescence device according to claim 1, wherein an end portion of the edge cover layer is defined in a pattern shape following a shape of a circumference of the recessed portion in a direction normal to the substrate.

3. The organic electroluminescence device according to claim 1, including a plurality of unit light emitting regions separated from one another; wherein
the unit light emitting regions each include a first region where a central portion of the first electrode is located and a second region where the end portion of the first electrode is located, and
the recessed portion is provided in the second region.

4. The organic electroluminescence device according to claim 3, wherein the recessed portion is also provided in the first region.

5. The organic electroluminescence device according to claim 3, wherein
the recessed portion is not provided in the first region, and
upper faces of the reflective layer, the first electrode, and the organic layer are smooth.

6. The organic electroluminescence device according to claim 3, wherein
a second recessed portion is provided adjacent to the recessed portion in the second region, and
the end portion of the first electrode is located at a distance from the reflective layer inside the second recessed portion.

7. The organic electroluminescence device according to claim 6, wherein
a cross-sectional shape of the second recessed portion is a parabola shape, and
the second recessed portion is defined to include the end portion of the first electrode as a focal point.

8. An illumination device comprising:
a base material;
a flattening resin layer provided on the base material, the flattening resin layer including one face on which a recessed portion is provided;
a reflective layer provided on at least a surface of the recessed portion;
a filling layer having optical transparency and filling a portion of an inside of the recessed portion via the reflective layer interposed between the filling layer and the recessed portion;
a first electrode having optical transparency and provided above the filling layer;
an organic layer containing at least a light emitting layer and provided on an upper layer of the first electrode;
a second electrode having optical transparency and provided above the organic layer; and
an edge cover layer that covers at least an end portion of the first electrode, and does not cover another portion of the first electrode, wherein
the another portion of the first electrode is in contact with the reflective layer at an upper face of the flattening resin layer,
an upper face of the first electrode at a position of the recessed portion is positioned below a plane including an upper face of the reflective layer, and
the end portion of the first electrode is located inside the recessed portion and at a distance from the reflective layer.

9. A display device comprising:
a base material;
a flattening resin layer provided on the base material, the flattening resin layer including one face provided on which a recessed portion is provided;
a reflective layer provided on at least a surface of the recessed portion;
a filling layer having optical transparency and filling a portion of an inside of the recessed portion via the reflective layer interposed between the filling layer and the recessed portion;
a first electrode having optical transparency and provided above the filling layer;
an organic layer containing at least a light emitting layer and provided on an upper layer of the first electrode;
a second electrode having optical transparency and provided above the organic layer; and
an edge cover layer that covers at least an end portion of the first electrode, and does not cover another portion of the first electrode, wherein
the another portion of the first electrode is in contact with the reflective layer at an upper face of the flattening resin layer,
an upper face of the first electrode at a position of the recessed portion is positioned below a plane including an upper face of the reflective layer, and
the end portion of the first electrode is located inside the recessed portion and at a distance from the reflective layer.

* * * * *